United States Patent
Mahmoudidaryan et al.

(10) Patent No.: US 11,108,325 B2
(45) Date of Patent: Aug. 31, 2021

(54) ELECTRONIC CIRCUIT AND METHOD OF CONTROLLING THREE-LEVEL SWITCHING CONVERTERS

(71) Applicants: Parisa Mahmoudidaryan, Tempe, AZ (US); Sayfe Kiaei, Fountain Hills, AZ (US); Bertan Bakkaloglu, Scottsdale, AZ (US)

(72) Inventors: Parisa Mahmoudidaryan, Tempe, AZ (US); Sayfe Kiaei, Fountain Hills, AZ (US); Bertan Bakkaloglu, Scottsdale, AZ (US)

(73) Assignee: ARIZONA BOARD OF REGENTS ON BBEHALF OF ARIZONA STATE UNIVERSITY, Scottsdale, AZ (US)

( * ) Notice: Subject to any disclaimer, the term of this patent is extended or adjusted under 35 U.S.C. 154(b) by 6 days.

(21) Appl. No.: 16/791,623

(22) Filed: Feb. 14, 2020

(65) Prior Publication Data
US 2020/0266708 A1 Aug. 20, 2020

Related U.S. Application Data

(60) Provisional application No. 62/805,693, filed on Feb. 14, 2019.

(51) Int. Cl.
*H02M 3/158* (2006.01)
*H02M 3/156* (2006.01)
(Continued)

(52) U.S. Cl.
CPC .............. *H02M 3/158* (2013.01); *H02M 3/07* (2013.01); *H02M 3/157* (2013.01);
(Continued)

(58) Field of Classification Search
CPC ........ H02M 3/158; H02M 3/07; H02M 3/157; H02M 2003/072; H02M 2001/0012; H02M 7/483
See application file for complete search history.

(56) References Cited

U.S. PATENT DOCUMENTS

| | | | |
|---|---|---|---|
| 7,218,085 B2 | 5/2007 | Abedinpour et al. | |
| 7,372,333 B2 | 5/2008 | Abedinpour et al. | |
| (Continued) | | | |

FOREIGN PATENT DOCUMENTS

| | | |
|---|---|---|
| WO | 2003100831 | 12/2003 |
| WO | 2004048909 | 6/2004 |
| WO | 2004070941 | 8/2004 |

OTHER PUBLICATIONS

Tan, M. et al., "A 100 MHz Hybrid Supply Modulator with Ripple-Current-Based PWM Control," IEEE Journal of Solid-State Circuits, Feb. 2017, [IEEE date of publication: Nov. 2016], vol. 52, No. 2, pp. 569-578, <10.1109/JSSC.2016.2611513>.
(Continued)

*Primary Examiner* — Alex Torres-Rivera
(74) *Attorney, Agent, or Firm* — Bryan Cave Leighton Paisner LLP

(57) ABSTRACT

A method including producing an electronic circuit. The method can include providing a first circuit portion, a second circuit portion, a flying capacitor voltage comparator, an output switching circuit, an electronic circuit first output node, and/or an electronic circuit second output node. The electronic circuit first output node can be electrically coupled to a first gate terminal of a switching converter. The electronic circuit second output node can be electrically coupled to a second gate terminal of the switching converter. The method also can include electrically coupling a voltage sensor output terminal of the flying capacitor voltage comparator to the first circuit second input node of the first circuit portion and the second circuit second input node of the second circuit portion. Other embodiments are disclosed.

20 Claims, 8 Drawing Sheets

(51) Int. Cl.
  *H02M 3/07* (2006.01)
  *H02M 3/157* (2006.01)
  *H02M 1/00* (2006.01)
(52) U.S. Cl.
  CPC .. *H02M 3/1563* (2013.01); *H02M 2001/0009* (2013.01); *H02M 2001/0012* (2013.01); *H02M 2003/072* (2013.01)

(56) References Cited

U.S. PATENT DOCUMENTS

| | | | |
|---|---|---|---|
| 7,528,754 B1 | 5/2009 | Bakkaloglu et al. | |
| 9,886,113 B2* | 2/2018 | Choi | G06F 3/0443 |
| 10,554,124 B1* | 2/2020 | Mangudi | H02M 3/07 |
| 2006/0052988 A1 | 3/2006 | Farahani et al. | |
| 2016/0329810 A1* | 11/2016 | Lee | H02M 3/158 |
| 2019/0058397 A1* | 2/2019 | Lazaro | H02M 3/158 |

OTHER PUBLICATIONS

Tan, M. et al., "An Efficiency-Enhanced Hybrid Supply Modulator with Single-Capacitor Current-Integration Control," IEEE Journal of Solid-State Circuits, Feb. 2016, [IEEE date of publication: Nov. 2015], vol. 51, No. 2, pp. 533-542, <DOI:10.1109/JSSC.2015.2490224>.
Tsai, W. et al., "Wide-Bandwidth and High-Linearity Envelope-Tracking Front-End Module for LTE-A Carrier Aggregation Applications," IEEE Transactions on Microwave Theory and Techniques, Nov. 2017, [IEEE date of publication: Sep. 2017], vol. 65, No. 11, pp. 4657-4668, <DOI:10.1109/TMTT.2017.2744622>.
Turkson, R. et al., "Envelope Tracking Technique with Bang-Bang Slew-Rate Enhancer for Linear Wideband RF PAs," 2013 IEEE 56th International Midwest Symposium on Circuits and Systems (MWSCAS) (Columbus, OH, Aug. 4-7, 2013), 2013, [Date added to IEEE Xplore Dec. 2013], pp. 629-632, <DOI:10.1109/MWSCAS.2013.6674727>.
Vasic, M. et al., "The Design of a Multilevel Envelope Tracking Amplifier Based on a Multiphase Buck Converter," IEEE Transactions on Power Electronics, Jun. 2016, [IEEE date of publication: Sep. 2015], vol. 31, No. 6, pp. 4611-4627, <DOI:10.1109/TPEL.2015.2476517>.
Wang, Y. et al., "Hysteresis Current Control for Multilevel Converter in Parallel-Form Switch-Linear Hybrid Envelope Tracking Power Supply," IEEE Transactions on Power Electronics, Feb. 2019, [IEEE date of publication: May 2018], vol. 34, No. 2, pp. 1950-1959, <DOI:10.1109/TPEL.2018.2835640>.
Wang, Y. et al., "Quasi-Interleaved Current Control for Switch-Linear Hybrid Envelope-Tracking Power Supply," IEEE Transactions on Power Electronics, Jun. 2018, [IEEE date of publication: Aug. 2017], vol. 33, No. 6, pp. 5415-5425, <DOI:10.1109/TPEL.2017.2735485>.
Watkins, G. et al., "How Not to Rely on Moores Law Alone: Low-Complexity Envelope-Tracking Amplifiers," IEEE Microwave Magazine, Jun. 2018, [IEEE date of publication: May 2018], vol. 19, No. 4, pp. 84-94, <DOI:10.1109/MMM.2018.2813840>.
Wu, P. et al., "A Two-Phase Switching Hybrid Supply Modulator for RF Power Amplifiers With 9% Efficiency Improvement," IEEE Journal of Solid-State Circuits, Dec. 2010, [IEEE date of publication: Oct. 2010], vol. 45, No. 12, pp. 2543-2556, <DOI:10.1109/JSSC.2010.2076510>.
Yousefzadeh, V. et al., "Three-Level Buck Converter for Envelope Tracking Applications," IEEE Transactions on Power Electronics, Mar. 2006, vol. 21, No. 2, pp. 549-552, <DOI:10.1109/TPEL.2005.869728>.
Amo, P. et al., "Envelope Modulator for Multimode Transmitters with AC-Coupled Multilevel Regulators," 2014 IEEE International Solid-State Circuits Conference Digest of Technical Papers (ISSCC) (San Francisco, CA, Feb. 9-13, 2014), 2014, [Date added to IEEE Xplore: Mar. 2014], pp. 296-297, <DOI:10.1109/ISSCC.2014.6757441>.
Aref, A. et al., "A Study of the Impact of Delay Mismatch on Linearity of Outphasing Transmitters," IEEE Transactions on Circuits and Systems I: Regular Papers, Jan. 2015, [IEEE date of publication: Oct. 2014], vol. 62, No. 1, pp. 254-262, <DOI:10.1109/TCSI.2014.2349573>.
Asbeck, P. et al., "ET Comes of Age: Envelope Tracking for Higher-Efficiency Power Amplifiers," IEEE Microwave Magazine, Mar. 2016, [IEEE date of publication: Feb. 2016], vol. 17, No. 3, pp. 16-25, <DOI:10.1109/MMM.2015.2505699>.
Briseno-Vidrios, C. et al., "A 13bit 200MS/s Pipeline ADC with Current-Mode MDACs," 2017 IEEE International Symposium on Circuits and Systems (ISCAS) (Baltimore, MD, May 28-31, 2017), 2017, [Date added to IEEE Xplore: Sep. 2017], 4 pages, <DOI:10.1109/ISCAS.2017.8050690>.
Briseno-Vidrios, C. et al., "A 44-fJ/Conversion Step 200-MS/s Pipeline ADC Employing Current-Mode MDACs," IEEE Journal of Solid-State Circuits, Nov. 2018, [IEEE date of publication: Aug. 2018], vol. 53, No. 11, pp. 3280-3292, <DOI:10.1109/JSSC.2018.2863959>.
Choi, J. et al., "A New Power Management IC Architecture for Envelope Tracking Power Amplifier," IEEE Transactions on Microwave Theory and Techniques, Jul. 2011, [IEEE date of publication May 2011], vol. 59. No. 7, pp. 1796-1802, <DOI:10.1109/TMTT.2011.2134108>.
Chu, W. et al., "A 10 MHz Bandwidth, 2 mV Ripple PA Regulator for CDMA Transmitters," IEEE Journal of Solid-State Circuits, Dec. 2008, vol. 43, No. 12, pp. 2809-2819, <DOI:10.1109/JSSC.20082005743>.
Doherty, W., "A New High Efficiency Power Amplifier for Modulated Waves," Proceedings of the Institute of Radio Engineers, Sep. 1936, vol. 24, No. 9, pp. 1163-1182, <DOI:10.1109/JRPROC.1936.228468>.
Ghaedrahmati, H. et al., "160 MS/s 20 MHz Bandwidth Third-Order Noise Shaping SAR ADC," Electronics Letters, Feb. 2018, vol. 54, No. 3, pp. 128-130, <DOI:10.1049/el.2017.3969>.
Ghaedrahmati, H. et al., "Gain-Boosted Complementary Dynamic Residue Amplifier for a 160 MS/s 61 dB SNDR Noise-Shaping SAR ADC," 2018 IEEE 61st International Midwest Symposium on Circuits and Systems (MWSCAS) (Windsor, ON, Aug. 5-8, 2018), 2018, [Date added to IEEE XPlore: Jan. 2019], pp. 141-144, <DOI:10.1109/MWSCAS.2018.8624092>.
Gwon, H. et al., "2-Phase 3-Level ETSM With Mismatch-Free Duty Cycles Achieving 88.6% Peak Efficiency for a 20-MHz LTE RF Power Amplifier," IEEE Transactions on Power Electronics, Apr. 2018, [IEEE date of publication: Sep. 2017], vol. 33, No. 4, pp. 2815-2819, <DOI:10.1109/TPEL.2017.2754651>.
Ham, J. et al., "CMOS Power Amplifier Integrated Circuit with Dual-Mode Supply Modulator for Mobile Terminals," IEEE Transactions on Circuits and Systems I: Regular Papers, Jan. 2016, vol. 63, pp. 157-167, <DOI: 10.1109/TCSI.2015.2512703>.
Hassan, M. et al., "A CMOS Dual-Switching Power-Supply Modulator with 8% Efficiency Improvement for 20MHz LTE Envelope Tracking RF Power Amplifiers," 2013 IEEE International Solid-State Circuits Conference Digest of Technical-Papers (San Francisco, CA, Feb. 17-21, 2013), 2013, [Date added to IEEE XPlore Mar. 2013], pp. 366-368, <DOI:10.1109/ISSCC.2013.6487772>.
Hassan, M. et al., "A Combined Series-Parallel Hybrid Envelope Amplifier for Envelope Tracking Mobile Terminal RF Power Amplifier Applications," IEEE Journal of Solid-State Circuits, May 2012, [IEEE date of publication: Feb. 2012], vol. 47, No. 5, pp. 1185-1198, <DOI:10.1109/JSSC.2012.2184639>.
He, H. et al., "A 2.5-W 40-MHz-Bandwidth Hybrid Supply Modulator With 91% Peak Efficiency, 3-V Output Swing, and 4-mV Output Ripple at 3.6-V Supply," IEEE Transactions on Power Electronics, Jan. 2019, [IEEE date of publication: Apr. 2018], vol. 34, No. 1, pp. 712-723, <DOI:10.1109/TPEL.2018.2827396>.
Ho, C. et al., "An 87.1% Efficiency RF-PA Envelope-Tracking Modulator for 80MHz LTE-Advanced Transmitter and 31dBm PA Output Power for HPUE in 0.153μm CMOS," 2018 IEEE International Solid—State Circuits Conference—(ISSCC) (San Francisco,

(56) References Cited

OTHER PUBLICATIONS

CA, Feb. 11-15, 2018), 2018, [Date added to IEEE Xplore: Mar. 2018], pp. 432-434, <DOI:10.1109/ISSCC.2018.8310369>.

Jing, Y. et al., "A High Slew-Rate Adaptive Biasing Hybrid Envelope Tracking Supply Modulator for LTE Applications," IEEE Transactions on Microwave Theory and Techniques, Sep. 2017, [IEEE date of publication: Mar. 2017], vol. 65, No. 9, pp. 3245-3256, <DOI:10.1109/TMTT.2017.2678476>.

Kahn, L., "Single-Sideband Transmission by Envelope Elimination and Restoration," Proceedings of the IRE, Jul. 1952, vol. 40. No. 7, pp. 803-806, <DOI:10.1109/JRPROC.1952.273844>.

Kim, C. et al., "A 500-MHz Bandwidth 7.5-mVpp Ripple Power-Amplifier Supply Modulator for RF Polar Transmitters," IEEE Journal of Solid-State Circuits, Jun. 2018, [IEEE date of publication Feb. 2018], vol. 53, No. 6, pp. 1653-1665, <DOI:10.1109/JSSC.2018.2804043>.

Kim, D. et al., "Highly Efficient Dual-Switch Hybrid Switching Supply Modulator for Envelope Tracking Power Amplifier," IEEE Microwave and Wireless Components Letters, Jun. 2012, [IEEE date of publication: May 2012], vol. 22, No. 6, pp. 285-287, <DOI:10.1109/LMWC.2012.2197382>.

Kim, J. et al., "Highly Efficient RF Transmitter Over Broad Average Power Range Using Multilevel Envelope-Tracking Power Amplifier," IEEE Transactions on Circuits and Systems I: Regular Papers, Jun. 2015, vol. 62, No. 6, pp. 1648-1657, <DOI:10.1109/TCSI.2015.2423771>.

Kim, W. et al., "A Fully-Integrated 3-Level DC-DC Converter for Nanosecond-Scale DVFS," IEEE Journal of Solid-State Circuits, Jan. 2012, [IEEE date of publication: Nov. 2011], vol. 47, No. 1, pp. 206-219, <DOI:10.1109/JSSC.2011.2169309>.

Kwak, T. et al., "A 2W CMOS Hybrid Switching Amplitude Modulator for EDGE Polar Transmitters," 2007 IEEE International Solid-State Circuits Conference, Digest of Technical Papers (San Francisco, CA, Feb. 11-15, 2007), 2007, [Date added to IEEE Xplore: Jun. 2007], pp. 2666-2676, <DOI:10.1109/ISSCC.2007.373522>.

Liu, X. et al., "A 2.4V 23.9dBm 35.7%-PAE-32.1dBc-ACLR LTE-20MHz Envelope-Shaping-and-Tracking System with a Multiloop-Controlled AC-Coupling Supply Modulator and a Mode-Switching PA," 2017 IEEE International Solid-State circuits Conference (ISSCC) (San Francisco, CA, Feb. 5-9, 2017), 2017, [Date added to IEEE Xplore: Mar. 2017], pp. 38-40, <DOI:10.1109/ISSCC.2017.7870249>.

Liu, X. et al., "A High-Frequency Three-Level Buck Converter With Real-Time Calibration and Wide Output Range for Fast-DVS," IEEE Journal of Solid-State Circuits, Feb. 2018, [IEEE date of publication: Oct. 2017], vol. 52. No. 2, pp. 582-595, <DOI:10.1109/JSSC.2017.2755683>.

Liu, X. et al., "A Multi-Loop-Controlled AC-Coupling Supply Modulator With a Mode-Switching CMOS PA in an EER System with Envelope Shaping," IEEE Journal of Solid-State Circuits, Jun. 2019, [IEEE date of publication: Feb. 2019], vol. 54, No. 6, pp. 1553-1563, <DOI:10.1109/JSSC.2019.2892555>.

Liu, X. et al., "Analysis and Design Considerations of Integrated 3-Level Buck Converter," IEEE Transactions on Circuits and Systems I: Regular Papers, May 2016, vol. 63, No. 5, pp. 671-682, <DOI:10.1109/TCSI.2016.2556098>.

Mahmoudidaryan, P. et al., "A 91%-Efficiency Envelope-Tracking Modulator Using Hysteresis-Controlled Three-Level Switching Regulator and Slew-Rate-Enhanced Linear Amplifier for LTE-80MHz Applications," 2019 IEEE International Solid-State Circuits Conference—(ISSCC) (San Francisco, CA, Feb. 17-21, 2019), 2019, [Date added to IEEE Xplore: Mar. 2019], pp. 428-430, <DOI:10.1109/ISSCC.2019.8662305>.

Mahmoudidaryan, P. et al., "Codesign of Ka-Band Integrated Limiter and Low Noise Amplifier," IEEE Transactions on Microwave Theory and Techniques, Sep. 2016, [IEEE date of publication: Jul. 2016], vol. 64, No. 9, pp. 2843-2852, <DOI:10.1109/TMTT.2016.2591534>.

Mahmoudidaryan, P. et al., "Wideband Hybrid Envelope Tracking Modulator With Hysteretic-Controlled Three-Level Switching Converter and Slew-Rate Enhanced Linear Amplifier," IEEE Journal of Solid-State Circuits, Dec. 2019, [IEEE date of publication: Oct. 2019], vol. 54, No. 12, pp. 3336-3347, <DOI:10.1109/JSSC.2019.2941014>.

Mahmoudidaryan, P., "Hybrid Envelope Tracking Supply Modulator Analysis and Design for Wideband Applications," Arizona State University, PhD Dissertation, Dec. 2019, [retrieved Jul. 26, 2020], 65 pages.

Meynard, T. et al., "Modeling of Multilevel Converters," IEEE Transactions on Industrial Electronics, Jun. 1997, vol. 44, No. 3, pp. 356-364, <DOI:10.1109/41.585833>.

Moallemi, S. et al., "CMOS Power Drivers for Digital Transmitters: Challenges and Architectures," 2019 IEEE Radio and Wireless Symposium (RWS) (Orlando, FL, Jan. 20-23, 2019), 2019, [Date added to IEEE Xplore: May 2019], 3 pages, <DOI10.1109/RWS.2019.8714222>.

Moallemi, S. et al., "Transformer Based Power Combining for Outphasing Power Amplifiers," 2018 Texas Symposium on Wireless and Microwave Circuits and Systems (WMCS) (Waco, TX, Apr. 5-6, 2018), 2018, [Date added to IEEE Xplore: Jul. 2018], 4 pages, <DOI:10.1109/WMCaS.2018.8400624>.

Moallemi, S. et al., "Wide Band Programmable True Time Delay Block for Phased Array Antenna Applications," 2016 IEEE Dallas Circuits and Systems Conference (DCAS) (Arlington, TX, Oct. 10, 2016), 2016, [Date added to IEEE Xplore: Feb. 2017], 4 pages, <DOI:10.1109/DCAS.2016.7847754>.

Naderi, M. et al., "Algorithmic-Pipelined ADC with a Modified Residue Curve for Better Linearity," 2017 IEEE 60th International Midwest Symposium on Circuits and Systems (MWSCAS) (Boston, MA, Aug. 6-9, 2017), 2017, [Date added to IEEE Xplore: Oct. 2017], pp. 1446-1449, <DOI:10.1109/MWSCAS.2017.8053205>.

Naderi, M. et al., "Operational Transconductance Amplifier with Class-B Slew-Rate Boosting for Fast High-Performance Switched-Capacitor Circuits," IEEE Transactions on Circuits and Systems I: Regular Papers, Nov. 2018, [IEEE date of publication: Aug. 2018], vol. 65, No. 11, pp. 3769-3779, <DOI:10.1109/TCSI.2018.2852273>.

Natarajan, V. et al., "Low Noise RF Quadrature VCO Using Tail-Switch Network-Based Coupling in 40 nm CMOS," 2018 IEEE Custom Integrated Circuits Conference (CICC) (San Diego, CA, Apr. 8-11, 2018), 2018, [Date added to IEEE Xplore: May 2018], 4 pages, <DOI:10.1109/CICC.2018.8357040>.

Nomiyama, T. et al., "A 2TX Supply Modulator for Envelope-Tracking Power Amplifier Supporting Intra- and Inter-Band Uplink Carrier Aggregation and Power Class-2 High-Power User Equipment," 2018 IEEE International Solid—State Circuits Conference—(ISSCC) (San Francisco, CA, Feb. 11-15, 2018), 2018, [Date added to IEEE Xplore: Mar. 2018], pp. 434-436, <DOI:10.1109/ISSCC.2018.8310370>.

Paek, J. et al., "An 88%-Efficiency Supply Modulator Achieving 1.08μs/V Fast Transition and 100MHz Envelope-Tracking Bandwidth for 5G New Radio RF Power Amplifier," 2019 IEEE International Solid-State Circuits Conference—(ISSCC) (San Francisco, CA, Feb. 17-21, 2019), 2019, [Date added to IEEE Xplore: Mar. 2019], pp. 238-240, <DOI:10.1109/ISSCC.2019.8662460>.

Paek, J. et al., "A—137 dBm/Hz Noise, 82% Efficiency AC-Coupled Hybrid Supply Modulator with Integrated Buck-Boost Converter," IEEE Journal of Solid-State Circuits, Nov. 2016, [IEEE date of publication: Sep. 2016], vol. 51, No. 11, pp. 2757-2768, <DOI:10.1109/JSSC.2016.2604296>.

Paek, J. et al., "An RF-PA Supply Modulator Achieving 83% Efficiency and -136 dBm/Hz Noise for LTE-40 MHz and GSM 35 dBm," 2016 IEEE International Solid-State Circuits Conference (ISSCC) (San Francisco, CA, Jan. 31-Feb. 4, 2016), 2016, [Date added to IEEE Xplore: 2016], pp. 354-356, <DOI:10.1109/ISSCC.2016.7418053>.

Paek, J. et al., "Design of Boosted Supply Modulator with Reverse Current Protection for Wide Battery Range in Envelope Tracking Operation," IEEE Transactions on Microwave Theory and Techniques, Jan. 2019, [IEEE date of publication: Nov. 2018], vol. 67, No. 1, pp. 183-194, <DOI:10.1109/TMTT.2018.2879323>.

(56) References Cited

OTHER PUBLICATIONS

Peng, Q. et al., "Integrated High-Efficiency Single-Inductor CCM Boost Converter for Multi-Junction PV Energy Harvesting," 2019 IEEE Applied Power Electronics Conference and Exposition (APEC) (Anaheim, CA, Mar. 17-21, 2019), 2019, [Date added to IEEE Xplore: May 2019], pp. 1313-1318, <DOI: 10.1109/APEC.2019.8722258>.

Prakash, S. et al., "An Agile Supply Modulator With Improved Transient Performance for Power Efficient Linear Amplifier Employing Envelope Tracking Techniques," IEEE Transactions on Power Electronics, Apr. 2020 [IEEE date of publication: Aug. 2019], vol. 35, No. 4, pp. 4178-4191, <DOI:10.1109/TPEL.2019.2934364>.

Qian, H. et al., "Power-Efficient CMOS Power Amplifiers for Wireless Applications," in: SU, C (ed.), "IoT and Low-Power Wireless" (CRC Press, 2018), pp. 215-238.

Riehl, P. et al., "An AC-Coupled Hybrid Envelope Modulator for HSUPA Transmitters with 80% Modulator Efficiency," 2013 IEEE International Solid-State Circuits Conference Digest of Technical Papers (San Francisco, CA, Feb. 17-21, 2013), 2013, [Date added to IEEE Xplore: Mar. 2013], pp. 364-366, <DOI:10.1109/ISSCC.2013.6487771>.

Sankman, J. et al., "Switching-Converter-Only Multiphase Envelope Modulator With Slew Rate Enhancer for LTE Power Amplifier Applications," IEEE Transactions on Power Electronics, Jan. 2016, [IEEE date of publication: Feb. 2015], vol. 31, No. 1, pp. 817-826, <DOI:10.1109/TPEL.2015.2406710>.

Shrestha, R. et al., "A Wideband Supply Modulator for 20 MHz RF Bandwidth Polar PAs in 65 nm CMOS," IEEE Journal of Solid-State Circuits, Apr. 2009 [IEEE date of publication: Mar. 2009], vol. 44, No. 4, pp. 1272-1280, <DOI:10.1109/JSSC.2009.2014730>.

Sung, S. et al., "Envelope Modulator for 1.5-W 10-MHz LTE PA Without AC Coupling Capacitor Achieving 86.5% Peak Efficiency," IEEE Transactions on Power Electronics, Dec. 2016, [IEEE date of publication: Jan. 2016], vol. 31, No. 12, pp. 8282-8292, <DOI:10.1109/TPEL.2016.2519243>.

\* cited by examiner

ELECTRONIC CIRCUIT AND METHOD OF CONTROLLING THREE-LEVEL SWITCHING CONVERTERS

CROSS-REFERENCE TO RELATED APPLICATIONS

This application claims priority to U.S. Provisional Patent Application No. 62/805,693, filed Feb. 14, 2019. U.S. Provisional Patent Application No. 62/805,693 is incorporated herein by reference in its entirety.

TECHNICAL FIELD

This invention relates to electronic circuits, in general, and to control circuits and methods of controlling three-level switching converters, in particular.

BACKGROUND

Power conversions between a power supply to a device and one or more sub-circuits of the device are common because different sub-circuits can have different voltage levels. As the technologies develop, devices become smaller and run faster. Accordingly, a need exists for an improved electronic circuit and an improved method of controlling power convertors. It is desired for the electronic circuit to have a reduced size, complexity, and response time without sacrificing its stability.

BRIEF DESCRIPTION OF THE FIGURES

The invention will be better understood from a reading of the following detailed description, taken in conjunction with the accompanying figures in which.

Figure 1:
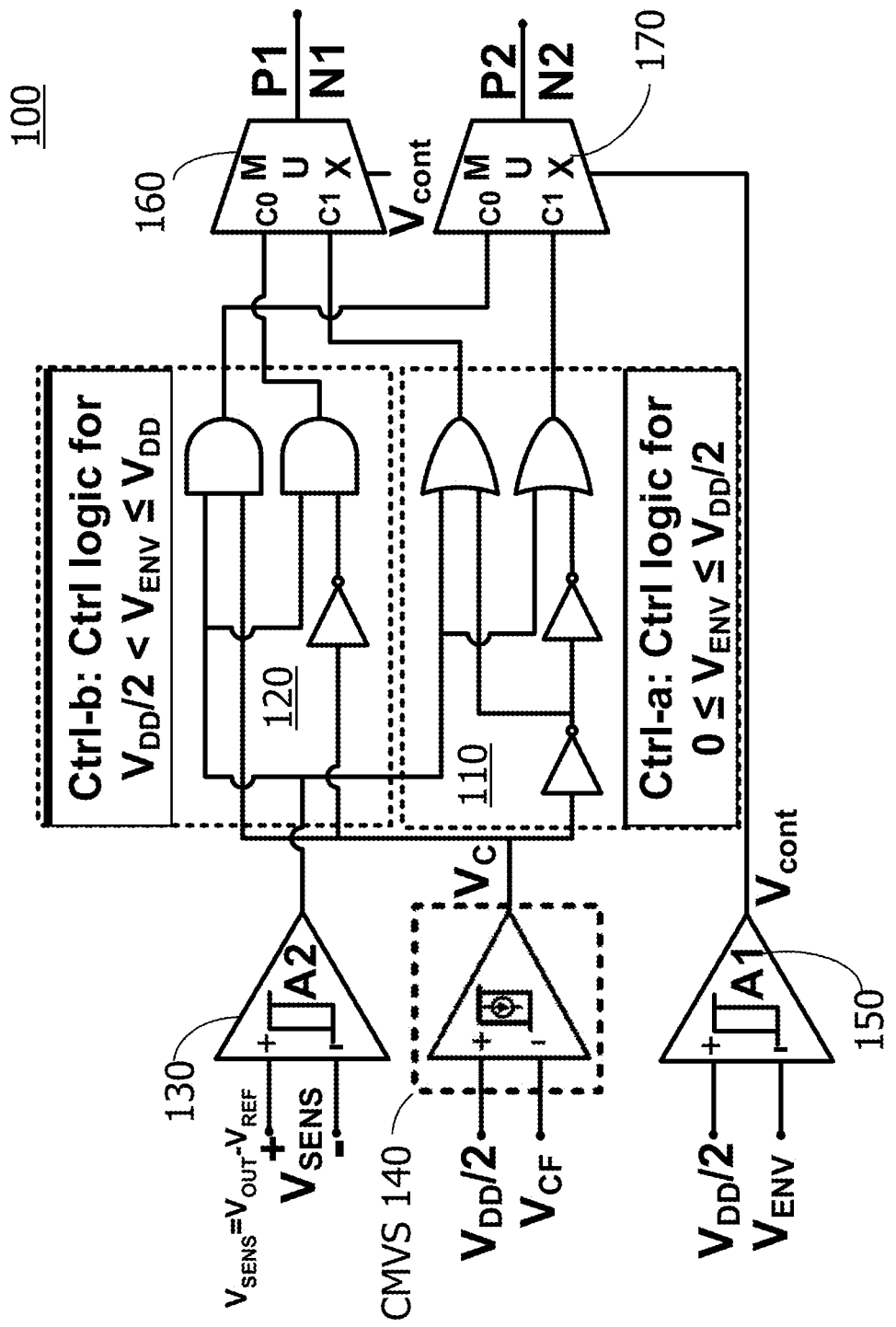
FIG. 1 illustrates a schematic diagram of an electronic circuit in accordance with an embodiment.

For simplicity and clarity of illustration, the drawing figures illustrate the general manner of construction, and descriptions and details of well-known features and techniques may be omitted to avoid unnecessarily obscuring the present disclosure. Additionally, elements in the drawing figures are not necessarily drawn to scale. For example, the dimensions of some of the elements in the figures may be exaggerated relative to other elements to help improve understanding of embodiments of the present disclosure. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the apparatus, methods, and/or articles of manufacture described herein are, for example, capable of operation in other orientations than those illustrated or otherwise described herein.

The terms "couple," "coupled," "couples," "coupling," and the like should be broadly understood and refer to connecting two or more elements mechanically and/or otherwise. Two or more electrical elements may be electrically coupled together, but not be mechanically or otherwise coupled together. Coupling may be for any length of time, e.g., permanent or semi-permanent or only for an instant. "Electrical coupling" and the like should be broadly understood and include electrical coupling of all types. The absence of the word "removably," "removable," and the like near the word "coupled," and the like does not mean that the coupling, etc. in question is or is not removable.

As defined herein, two or more elements are "integral" if they are comprised of the same piece of material. As defined herein, two or more elements are "non-integral" if each is comprised of a different piece of material.

As defined herein, "approximately" can, in some embodiments, mean within plus or minus ten percent of the stated value. In other embodiments, "approximately" can mean within plus or minus five percent of the stated value. In further embodiments, "approximately" can mean within plus or minus three percent of the stated value. In yet other embodiments, "approximately" can mean within plus or minus one percent of the stated value.

DESCRIPTION OF EXAMPLES OF EMBODIMENTS

Various embodiments can include an electronic circuit. In some embodiments, the electronic circuit can be a hysteresis control loop for a switching converter, such as a three-level switching converter for an envelope tracking (ET) modulator, a direct current to direct current (DC-DC) converter, an average power tracking (APT) modulator, etc. An exemplary switching converter can comprise one or more of: a first p-type transistor, a second p-type transistor, a first n-type transistor, a second n-type transistor, a flying capacitor, a first gate terminal, a second gate terminal, a power source voltage, an output voltage, or a reference voltage. In many embodiments, the electronic circuit can comprise: (a) a first circuit portion; (b) a second circuit portion; (c) a flying capacitor voltage comparator; (d) an output switching circuit; (e) an electronic circuit first output node; and/or (f) an electronic circuit second output node.

The first circuit portion in an embodiment can comprise: (a) a first circuit first input node; (b) a first circuit second input node; (c) a first circuit first output node; and/or (d) a first circuit second output node. In some embodiments, when the first circuit first input node is pulled high, the first circuit first output node and the first circuit second output node both can be pulled high. In several embodiments, when the first circuit first input node is pulled low and when the first circuit second input node is pulled low, the first circuit first output node can be pulled high and the first circuit second output node can be pulled low. In a number of embodiments, when the first circuit first input node is pulled low and when the first circuit second input node is pulled high, the first circuit first output node can be pulled low and the first circuit second output node can be pulled high.

In a number of embodiments, the first circuit portion further can comprise a first OR gate, a second OR gate, a first NOT gate, and/or a second NOT gate. The first circuit first input node can be electrically coupled to a first input terminal of the first OR gate and a first input terminal of the second OR gate. The first circuit second input node can be electrically coupled to an input terminal of the first NOT gate. The first NOT gate can include an output terminal that is electrically coupled to a second input terminal of the first OR gate and an input terminal of the second NOT gate. The second NOT gate can include an output terminal electrically coupled to a second input terminal of the second OR gate. The first circuit first output node can be electrically coupled to an output terminal of the first OR gate. The first circuit second output node can be electrically coupled to an output terminal of the second OR gate.

In many embodiments, the second circuit portion can comprise: (a) a second circuit first input node; (b) a second circuit second input node; (c) a second circuit first output node; and/or (d) a second circuit second output node. When the second circuit first input node and the second circuit second input node are both pulled high, the second circuit first output node can be pulled high and the second circuit second output node can be pulled low. When the second circuit first input node is pulled high and when the second circuit second input node is pulled low, the second circuit first output node can be pulled low and the second circuit second output node can be pulled high. When the first circuit first input node is pulled low, the second circuit first output node and the second circuit second output node both can be pulled low.

In some embodiments, the second circuit portion further can comprise a first AND gate, a second AND gate, and/or a NOT gate. The second circuit first input node can be electrically coupled to a first input terminal of the first AND gate and a first input terminal of the second AND gate. The second circuit second input node can be electrically coupled to a second input terminal of the first AND gate and an input terminal of the NOT gate. An output terminal of the NOT gate can be electrically coupled to a second input terminal of the second AND gate. The second circuit first output node can be electrically coupled to an output terminal of the first AND gate. The second circuit second output node can be electrically coupled to an output terminal of the second AND gate.

In a number of embodiments, the electronic circuit first output node of the electronic circuit can be configured to be electrically coupled to a first gate terminal of a switching converter. The switching converter can be similar or identical to the aforementioned exemplary switching converter. In some embodiments, the electronic circuit second output node can be configured to be electrically coupled to a second gate terminal of the switching converter. In some embodiments, the first circuit first input node of the first circuit portion and the second circuit first input node of the second circuit portion can be electrically coupled to an indication of whether an output voltage of the switching converter is higher in magnitude than a reference voltage of the switching converter.

In a number of embodiments, the flying capacitor voltage comparator of the electronic circuit can be configured to detect whether a flying capacitor voltage is within a range or whether the flying capacitor voltage is higher or lower in magnitude than a constant voltage value. The flying capacitor voltage can be a voltage across a flying capacitor of the switching converter. In some embodiments, the flying capacitor voltage comparator can include a voltage sensor output terminal, and an output value of the voltage sensor output terminal can be indicative of whether a constant half source voltage is higher or lower in magnitude than the flying capacitor voltage. The constant half source voltage can be a half of a power source voltage of the switching converter. In some embodiments, the voltage sensor output terminal of the flying capacitor voltage comparator can be electrically coupled to the first circuit second input node of the first circuit portion and the second circuit second input node of the second circuit portion.

In some embodiments, the flying capacitor voltage comparator further can comprises: a first current converting circuit, a second current converting circuit, and/or a current comparison circuit. The first current converting circuit can be configured to generate a half source current from the constant half source voltage. The second current converting circuit can be configured to generate a flying capacitor current from the flying capacitor voltage. When the flying capacitor current is less than the half source current, an output terminal of the current comparison circuit can be pulled high. When the flying capacitor current is no less than the half source current, the output terminal of the current comparison circuit can be pulled low.

In certain embodiments, the half source current can include a lower tolerance limit current and an upper tolerance limit current. When the flying capacitor current is less than the lower tolerance limit current, the output terminal of the current comparison circuit can be pulled high. When the flying capacitor current is no less than the lower tolerance limit current, the output terminal of the current comparison circuit can be pulled low.

In a number of embodiments, the first current converting circuit of the flying capacitor voltage comparator can include a first circuit path and a second circuit path. The first circuit path can be configured to generate the lower tolerance limit current and can include a first resistor, a first top n-type transistor, and/or a first bottom n-type transistor. The first resistor can comprise: (a) a first resistance value; (b) a first resistor top terminal electrically coupled to a constant half source voltage node configured to supply the constant half source voltage; and/or (c) a first resistor bottom terminal.

In some embodiments, the first top n-type transistor of the first circuit path can include: (a) a first top gate terminal electrically coupled to a bias voltage node configured to supply a bias voltage; (b) a first top source terminal electrically coupled to the first resistor bottom terminal of the first resistor; and/or (c) a first top drain terminal. The first bottom n-type transistor of the first circuit path can comprise: (a) a first bottom gate terminal electrically coupled to the first resistor bottom terminal of the first resistor; (b) a first bottom source terminal electrically coupled to the first top drain terminal of the first top n-type transistor; and (c) a first bottom drain terminal electrically coupled to a ground node.

In many embodiments, the second circuit path of the first current converting circuit can be configured to generate the upper tolerance limit current. The second circuit path can include: a second resistor, a second top n-type transistor, and/or a second bottom n-type transistor. The second resistor can comprise: (a) a second resistance value; (b) a second resistor top terminal electrically coupled to the constant half source voltage node; and (c) a second resistor bottom terminal. The second resistance value can be less than first resistance value of the first resistor of the first circuit path. The second top n-type transistor can include: (a) a second top gate terminal electrically coupled to the bias voltage node; (b) a second top source terminal electrically coupled to the second resistor bottom terminal of the second resistor; and/or (c) a second top drain terminal. The second bottom n-type transistor can include: (a) a second bottom gate terminal electrically coupled to the second resistor bottom terminal of the second resistor; (b) a second bottom source terminal electrically coupled to the second top drain terminal of the second top n-type transistor; and/or (c) a second bottom drain terminal electrically coupled to the ground node.

In a number of embodiments, the second current converting circuit of the flying capacitor voltage comparator can include a third circuit path. The third circuit path can be configured to generate the flying capacitor current. The third circuit path can comprise a third resistor, a third top n-type transistor, and/or a third bottom n-type transistor. The third resistor can include: (a) a third resistance value; (b) a third resistor top terminal electrically coupled to a positive terminal of the flying capacitor; and/or (c) a third resistor bottom terminal. The third resistance value can be greater than the second resistance value while being less than the first resistance value.

In some embodiments, the third top n-type transistor can comprise: (a) a third top gate terminal electrically coupled to the positive terminal of the flying capacitor; (b) a third top source terminal electrically coupled to the third resistor bottom terminal of the third resistor; and a third top drain terminal; and (c) a third bottom n-type transistor. The third bottom n-type transistor can include: (a) a third bottom gate terminal electrically coupled to the third resistor bottom terminal of the third resistor; (b) a third bottom source terminal electrically coupled to the third top drain terminal of the third top n-type transistor; and/or (c) a third bottom drain terminal electrically coupled to a negative terminal of the flying capacitor.

In a number of embodiments, the current comparison circuit of the flying capacitor voltage comparator can include a first mirror circuit path, a second mirror circuit path, a third mirror circuit path, and/or a latch. The first mirror circuit path can include: a first mirror p-type transistor, a first mirror top n-type transistor, and/or a first mirror bottom n-type transistor. The first mirror p-type transistor can comprise: (a) a first mirror p-type transistor gate terminal; (b) a first mirror p-type transistor source terminal electrically coupled to a power source node configured to supply the power source voltage; and/or (c) a first mirror p-type transistor drain terminal. The first mirror top n-type transistor of the first mirror circuit path can include: (a) a first mirror top gate terminal electrically coupled to the bias voltage node; (b) a first mirror top source terminal electrically coupled to the first mirror p-type transistor drain terminal of the first mirror p-type transistor; and/or (c) a first mirror top drain terminal. The first mirror bottom n-type transistor of first mirror circuit path can comprise: (a) a first mirror bottom gate terminal electrically coupled to the first resistor bottom terminal of the first resistor of the first circuit path of the first current converting circuit; (b) a first mirror bottom source terminal electrically coupled to the first mirror top drain terminal of the first mirror top n-type transistor; and/or (c) a first mirror bottom drain terminal electrically coupled to the ground node.

In some embodiments, the second mirror circuit path of the current comparison circuit of the flying capacitor voltage comparator can comprise a second mirror p-type transistor, a second mirror top n-type transistor, and/or a second mirror bottom n-type transistor. The second mirror p-type transistor can include: (a) a second mirror p-type transistor gate terminal; (b) a second mirror p-type transistor source terminal electrically coupled to the power source node; and/or (c) a second mirror p-type transistor drain terminal. The second mirror top n-type transistor can comprise: (a) a second mirror top gate terminal electrically coupled to the bias voltage node; (b) a second mirror top source terminal electrically coupled to the second mirror p-type transistor drain terminal of the second mirror p-type transistor; and/or (c) a second mirror top drain terminal. The second mirror bottom n-type transistor can include: (a) a second mirror bottom gate terminal electrically coupled to the second resistor bottom terminal of the second resistor of the second circuit path of the first current converting circuit; (b) a second mirror bottom source terminal electrically coupled to the second mirror top drain terminal of the second mirror top n-type transistor; and/or (c) a second mirror bottom drain terminal electrically coupled to the ground node.

In some embodiments, the third mirror circuit path of the current comparison circuit of the flying capacitor voltage comparator can comprise: a third mirror p-type transistor, a third mirror top n-type transistor, and/or a third mirror bottom n-type transistor. The third mirror p-type transistor can include: (a) a third mirror p-type transistor gate terminal; (b) a third mirror p-type transistor source terminal electrically coupled to the power source node; and/or (c) a third mirror p-type transistor drain terminal. The third mirror top n-type transistor can comprise: (a) a third mirror top gate terminal electrically coupled to the positive terminal of the flying capacitor; (b) a third mirror top source terminal electrically coupled to the third mirror p-type transistor drain terminal of the third mirror p-type transistor; and/or (c) a third mirror top drain terminal. The third mirror bottom n-type transistor can include: (a) a third mirror bottom gate terminal electrically coupled to the third resistor bottom terminal of the third resistor of the third circuit path of the second current converting circuit; (b) a third mirror bottom source terminal electrically coupled to the third mirror top drain terminal of the third mirror top n-type transistor; and/or (c) a third mirror bottom drain terminal electrically coupled to the negative terminal of the flying capacitor.

In many embodiments, the latch of the current comparison circuit of the flying capacitor voltage comparator can include: (a) a set input terminal electrically coupled to the second mirror top drain terminal of the second mirror top n-type transistor; (b) an opposite reset input terminal electrically coupled to the first mirror top drain terminal of the first mirror top n-type transistor; and/or (c) a complement queue output terminal. When the set input terminal and the opposite reset input terminal are both pulled low, the complement queue output terminal can be pulled high. When the set input terminal and the opposite reset input terminal are both pulled high, the complement queue output terminal can be pulled low. The first mirror p-type transistor gate terminal, the second mirror p-type transistor gate terminal, and the third mirror p-type transistor gate terminal can be electrically coupled to the third mirror p-type transistor drain terminal. The output terminal of the current comparison circuit can be electrically coupled to the complement queue output terminal of the latch.

In many embodiments, when the constant half source voltage is higher in magnitude than the reference voltage, the output switching circuit of the electronic circuit can be configured to electrically couple the electronic circuit first output node to the first circuit first output node of the first circuit portion and electrically couple the electronic circuit second output node to the first circuit second output node of the first circuit portion.

In some embodiments, when the constant half source voltage is not higher in magnitude than the reference voltage, the output switching circuit can be configured to electrically couple the electronic circuit first output node to the second circuit first output node of the second circuit portion and electrically couple the electronic circuit second output node to the second circuit second output node of the second circuit portion.

In a number of embodiments, the output switching circuit further can comprise a switching comparator, a first four-terminal multiplexer, and/or a second four-terminal multiplexer. The switching comparator can comprise a first input terminal, a second input terminal, and/or an output terminal. The first four-terminal multiplexer and the second four-terminal multiplexer each can comprise a first input terminal, a second terminal, and/or an output terminal.

In some embodiments, the first input terminal of the switching comparator of the output switching circuit can be configured to receive the constant half source voltage. The second input terminal of the switching comparator can be configured to receive the reference voltage. The output terminal of the switching comparator can be electrically coupled to both a control terminal of the first four-terminal multiplexer and a control terminal of the second four-terminal multiplexer.

In a number of embodiments, the first input terminal of the first four-terminal multiplexer of the output switching circuit can be electrically coupled to the first circuit first output node of the first circuit portion. The second input terminal of the first four-terminal multiplexer can be electrically coupled to the second circuit second output node of the second circuit portion. The first input terminal of the second four-terminal multiplexer can be electrically coupled to the first circuit second output terminal of the first circuit portion. The second input terminal of the second four-terminal multiplexer can be electrically coupled to the second circuit first output terminal of the second circuit portion. The output terminal of the first four-terminal multiplexer can be electrically coupled to the electronic circuit first output node. The output terminal of the second four-terminal multiplexer can be electrically coupled to the electronic circuit second output node.

In many embodiments, the electronic circuit further can include a sensing comparator. The sensing comparator can comprise a first input terminal, a second input terminal, and/or an output terminal. The first input terminal of the sensing comparator can be configured to receive the output voltage of the switching converter. The second input terminal of the sensing comparator can be configured to receive the reference voltage of the switching converter. The output terminal of the sensing comparator can be electrically coupled to the first circuit first input node of the first circuit portion and the second circuit first input node of the second circuit portion.

Further, a number of embodiments can include a method for producing an electronic circuit. The electronic circuit can include some or all of the components of the aforementioned electronic circuits. The method can include providing a first circuit portion, a second circuit portion, a flying capacitor voltage comparator, an output switching circuit, an electronic circuit first output node, and/or an electronic circuit second output node. The electronic circuit first output node can be electrically coupled to a first gate terminal of a switching converter. The electronic circuit second output node can be electrically coupled to a second gate terminal of the switching converter. The method also can include electrically coupling a voltage sensor output terminal of the flying capacitor voltage comparator to the first circuit second input node of the first circuit portion and the second circuit second input node of the second circuit portion. The first circuit first input node of the first circuit portion and the second circuit first input node of the second circuit portion both can be electrically coupled to an indication of whether an output voltage of the switching converter is higher in magnitude than a reference voltage of the switching converter. An output value of the voltage sensor output terminal can be indicative of whether a constant half source voltage is higher or lower in magnitude than a flying capacitor voltage. The constant half source voltage can be a half of a power source voltage of the switching converter. The flying capacitor voltage can be a voltage across a flying capacitor of the switching converter. When the constant half source voltage is higher in magnitude than the reference voltage, the output switching circuit can: (a) electrically couple the electronic circuit first output node to the first circuit first output node of the first circuit portion; and (b) electrically couple the electronic circuit second output node to the first circuit second output node of the first circuit portion. When the constant half source voltage is not higher in magnitude than the reference voltage, the output switching circuit can: (a) electrically couple the electronic circuit first output node to the second circuit first output node of the second circuit portion; and (b) electrically couple the electronic circuit second output node to the second circuit second output node of the second circuit portion.

Moreover, various embodiments can include a method for using an electronic circuit. The method can include providing an electronic circuit similar or identical to any of the aforementioned electronic circuits. The method additionally can include providing a three-level switching converter. The three-level switching converter can include: (a) a first p-type transistor; (b) a second p-type transistor; (c) a first n-type transistor; (d) a second n-type transistor; (e) a flying capacitor; (f) a first gate terminal electrically coupled to a gate terminal of the first p-type transistor and a gate terminal of the first n-type transistor; and/or (g) a second gate terminal electrically coupled to a gate terminal of the second p-type transistor and a gate terminal of the second n-type transistor. The method also can include electrically coupling an electronic circuit first output node of the electronic circuit to the first gate terminal of the three-level switching converter. The method further can include electrically coupling an electronic circuit second output node of the electronic circuit to the second gate terminal of the three-level switching converter.

In some embodiments, the first p-type transistor of the three-level switching converter can include a source terminal electrically coupled to a power source node configured to supply a power source voltage. The second p-type transistor of three-level switching converter can include a source terminal electrically coupled to a drain terminal of the first p-type transistor. The second n-type transistor of the three-level switching converter can include a source terminal electrically coupled to a drain terminal of the second p-type transistor. The first n-type transistor of the three-level switching converter can include: (a) a source terminal electrically coupled to a drain terminal of the second n-type transistor; and/or (b) a drain terminal electrically coupled to a ground node. The flying capacitor of the three-level switching converter can include: (a) a positive terminal electrically coupled to the drain terminal of the first p-type transistor; and/or (b) a negative terminal electrically coupled to the drain terminal of the second p-type transistor.

Turning to the drawings, FIG. 1 illustrates a circuit diagram of electronic circuit 100, according to an embodiment. In many embodiments, electronic circuit 100 can comprise a hysteresis control loop for a three-level switching converter and can be designed with simple, high-speed logic circuits configured to maintain the voltage of a flying capacitor, $V_{CF}$, of the three-level switching converter in each cycle. Electronic circuit 100 is merely exemplary, and embodiments of electronic circuit 100 are not limited to the embodiment presented herein. Electronic circuit 100 can be employed in many different embodiments or examples not specifically depicted or described herein.

As illustrated in FIG. 1, in this embodiment, electronic circuit 100 comprises first circuit portion 110 (Ctrl-a), second circuit portion 120 (Ctrl-b), hysteresis comparator 130 (A2), flying capacitor voltage comparator 140 (CMVS), hysteresis comparator 150 (A1), multiplexer 160, and multiplexer 170. In this embodiment illustrated in FIG. 1, multiplexers 160 and 170 can choose the proper control signal and send out based on the output of hysteresis comparator 150. In this embodiment, hysteresis comparator 140 (A1) compares a reference voltage, $V_{REF}(=V_{ENV})$, with $V_{DD}/2$.

If $V_{REF}<V_{DD}/2$: multiplexers 160 and 170 send out the output (N1=P1, N2=P2) of Ctrl-a path, i.e. first circuit portion 110.

If $V_{REF}>V_{DD}/2$: the multiplexers send out the output (N1=P1, N2=P2) of Ctrl-b path, i.e. second circuit portion 120.

In this embodiment, flying capacitor voltage comparator 140 (CMVS) can be a simple, high-speed current mode sensor configured to detect whether the flying capacitor voltage $V_{CF}$ is in the desired range, $V_{DD}/2\pm\Delta V$. In other embodiments, flying capacitor voltage comparator 140 can comprise a voltage subtractor, or a differential amplifier, and a conventional comparator configured to compare $V_{DD}/2$ and $V_{CF}$, provided by the voltage subtractor by subtracting the voltages between the terminals of the flying capacitor of the three-level switching converter.

In many embodiments, electronic circuit 100 can comprise an output switching circuit configured to switch between first circuit portion 110 and second circuit portion 120 based on a relationship between a flying capacitor of a three-level switching converter and a half of the source power ($V_{DD}/2$). In this embodiment illustrated in FIG. 1, the output switching circuit can comprise: a switching comparator, such as hysteresis comparator 150 (A1); a first four-terminal multiplexer, such as multiplexer 160; and a second four-terminal multiplexer, such as multiplexer 170. In this embodiment, a first input terminal of the switching comparator is configured to receive the constant half source voltage, ($V_{DD}/2$); a second input terminal of the switching comparator is configured to receive the reference voltage ($V_{REF}$); an output terminal of the switching comparator is electrically coupled to both a control terminal of the first four-terminal multiplexer and a control terminal of the second four-terminal multiplexer; a first input terminal of the first four-terminal multiplexer is electrically coupled to the first circuit first output node of the first circuit portion; a second input terminal of the first four-terminal multiplexer is electrically coupled to the second circuit second output node of the second circuit portion; a first input terminal of the second four-terminal multiplexer is electrically coupled to the first circuit second output terminal of the first circuit portion; a second input terminal of the second four-terminal multiplexer is electrically coupled to the second circuit first output terminal of the second circuit portion; an output terminal of the first four-terminal multiplexer is electrically coupled to the electronic circuit first output node; and an output terminal of the second four-terminal multiplexer is electrically coupled to the electronic circuit second output node.

Figure 2:
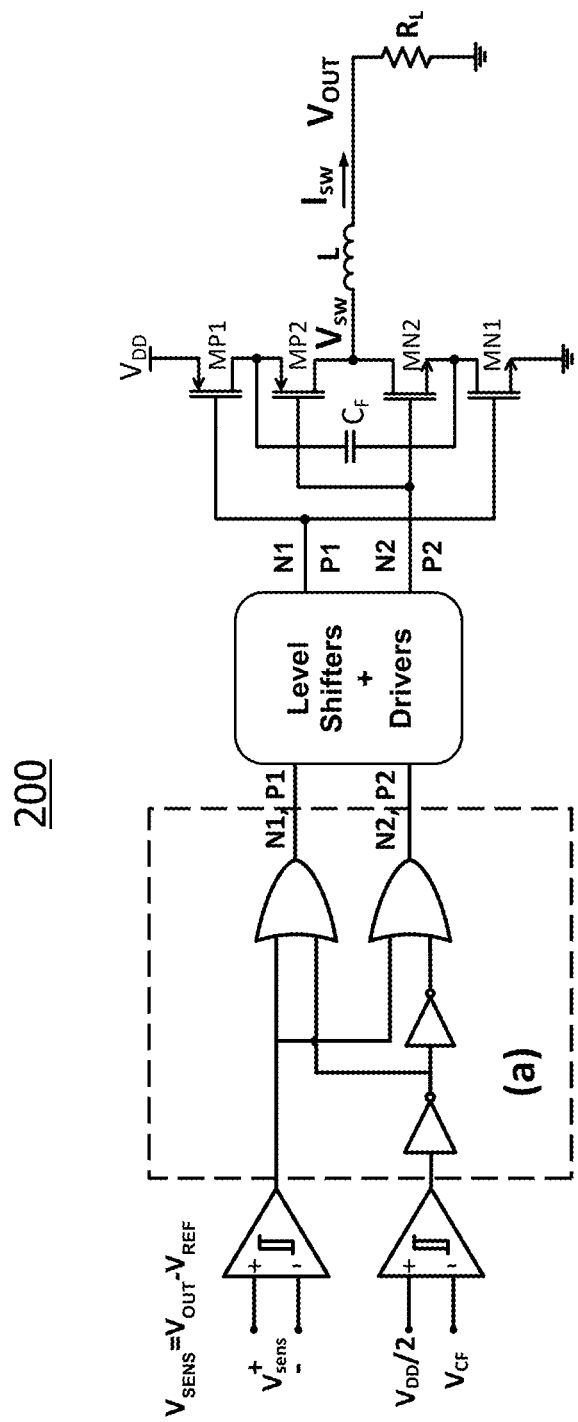
FIG. 2 illustrates a schematic diagram of an electronic circuit, in accordance with an embodiment.

Turning ahead in the drawings, FIG. 2 illustrates electronic circuit 200 with exemplary first circuit portion (a), according to an embodiment. Electronic circuit 200 and first circuit portion (a) are merely exemplary, and embodiments of electronic circuit 200 and/or first circuit portion (a) are not limited to the embodiment presented herein. Electronic circuit 200 and/or first circuit portion (a) can be employed in many different embodiments or examples not specifically depicted or described herein. For example, first circuit portion (a) can be employed, in part or entirely, in electronic circuit 100 in FIG. 1 as first circuit portion 110.

In this embodiment, when $V_{REF}<V_{DD}/2$, $V_{SW}$ switches between 0 and $V_{DD}/2$. The operation of first circuit portion (a) can break down into two conditions:

If $V_{OUT}>V_{REF}$, then (N1, N2, P1, P2: logic high);
then (MN1, MN2: ON) & (MP1, MP2: OFF);
then $V_{SW}$ pulls down to ground and decreases $I_{SW}$ and $V_{OUT}$, and $V_{CF}$ remains unchanged.

If $V_{OUT}<V_{REF}$, then the operation depends on the $V_{CF}$ voltage:
If $V_{CF}<V_{DD}/2$), then (N1, P1: logic low) & (N2, P2: logic high);
then (MN1, MP2: OFF) & (MP1, MN2: ON);
then $V_{SW}$ pulls up to $V_{DD}/2$ to increase $V_{OUT}$, while charging the $C_F$ and increasing $V_{CF}$ to reach desired value of $V_{DD}/2$.
If $V_{CF}>V_{DD}/2$, then (N1, P1: logic high) & (N2, P2: logic low);
then (MN1, MP2: ON) & (MP1, MN2: OFF);
then $V_{SW}$ pulls up to $V_{DD}/2$ to increase $V_{OUT}$, while discharging the $C_F$ and decreasing $V_{CF}$ to reach desired value of $V_{DD}/2$.

As illustrated in FIG. 2, first circuit portion (a) in this embodiment can comprise: a first OR gate; a second OR gate; a first NOT gate; and a second NOT gate. In this embodiment, the first circuit first input node is electrically coupled to a first input terminal of the first OR gate and a first input terminal of the second OR gate; the first circuit second input node is electrically coupled to an input terminal of the first NOT gate; an output terminal of the first NOT gate is electrically coupled to a second input terminal of the first OR gate and an input terminal of the second NOT gate; an output terminal of the second NOT gate is electrically coupled to a second input terminal of the second OR gate; the first circuit first output node is electrically coupled to an output terminal of the first OR gate; and the first circuit second output node is electrically coupled to an output terminal of the second OR gate.

Figure 3:
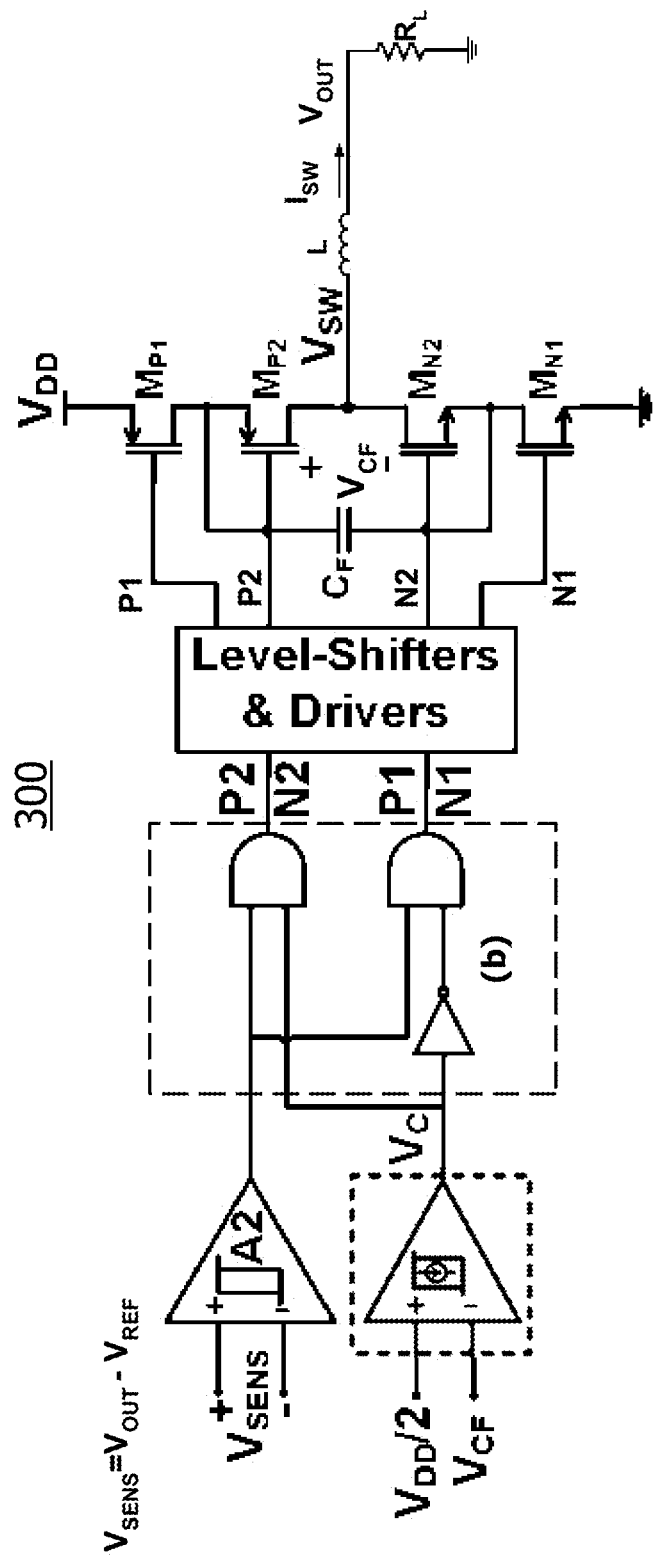
FIG. 3 illustrates a schematic diagram of an electronic circuit, in accordance with an embodiment.

Turning ahead in the drawings, FIG. 3 illustrates electronic circuit 300 with exemplary second circuit portion (b), according to an embodiment. Electronic circuit 300 and second circuit portion (b) are merely exemplary, and embodiments of electronic circuit 300 and/or second circuit portion (b) are not limited to the embodiment presented herein. Electronic circuit 300 and/or second circuit portion (b) can be employed in many different embodiments or examples not specifically depicted or described herein. For example, second circuit portion (b) can be employed, in part or entirely, in electronic circuit 100 in FIG. 1 as second circuit portion 120.

In this embodiment, when $V_{REF} < V_{DD}/2$, $V_{SW}$ switches between $V_{DD}/2$ and $V_{DD}$. The operation of second circuit portion (b) can break down into two conditions:

If $V_{OUT} < V_{REF}$, then (N1, N2, P1, P2: logic low);
then (MN1, MN2: OFF) & (MP1, MP2: ON);
then $V_{SW}$ pulls up to $V_{DD}$ and increases $I_{SW}$ and $V_{OUT}$, and $V_{CF}$ remains unchanged.

If $V_{OUT} > V_{REF}$→the operation depends on the $V_{CF}$ voltage:
If $V_{CF} < V_{DD}/2$, then (N1, P1: logic low) & (N2, P2: logic high);
then (MN1, MP2: OFF) & (MP1, MN2: ON);
then $V_{SW}$ pulls down to $V_{DD}/2$ to decrease $V_{OUT}$, while charging the $C_F$ and increasing $V_{CF}$ to reach desired value of $V_{DD}/2$.

If $V_{CF} > V_{DD}/2$, then (N1, P1: logic high) & (N2, P2: logic low);
then (MN1, MP2: ON) & (MP1, MN2: OFF);
then $V_{SW}$ pulls down to $V_{DD}/2$ to decrease $V_{OUT}$, while discharging the $C_F$ and decreasing $V_{CF}$ to reach desired value of $V_{DD}/2$.

As illustrated in FIG. 3, second circuit portion (b) in this embodiment can comprise: a first AND gate; a second AND gate; and a NOT gate. In this embodiment, the second circuit first input node is electrically coupled to a first input terminal of the first AND gate and a first input terminal of the second AND gate; the second circuit second input node is electrically coupled to a second input terminal of the first AND gate and an input terminal of the NOT gate; an output terminal of the NOT gate is electrically coupled to a second input terminal of the second AND gate; the second circuit first output node is electrically coupled to an output terminal of the second AND gate; and the second circuit second output node is electrically coupled to an output terminal of the first AND gate.

Figure 4:
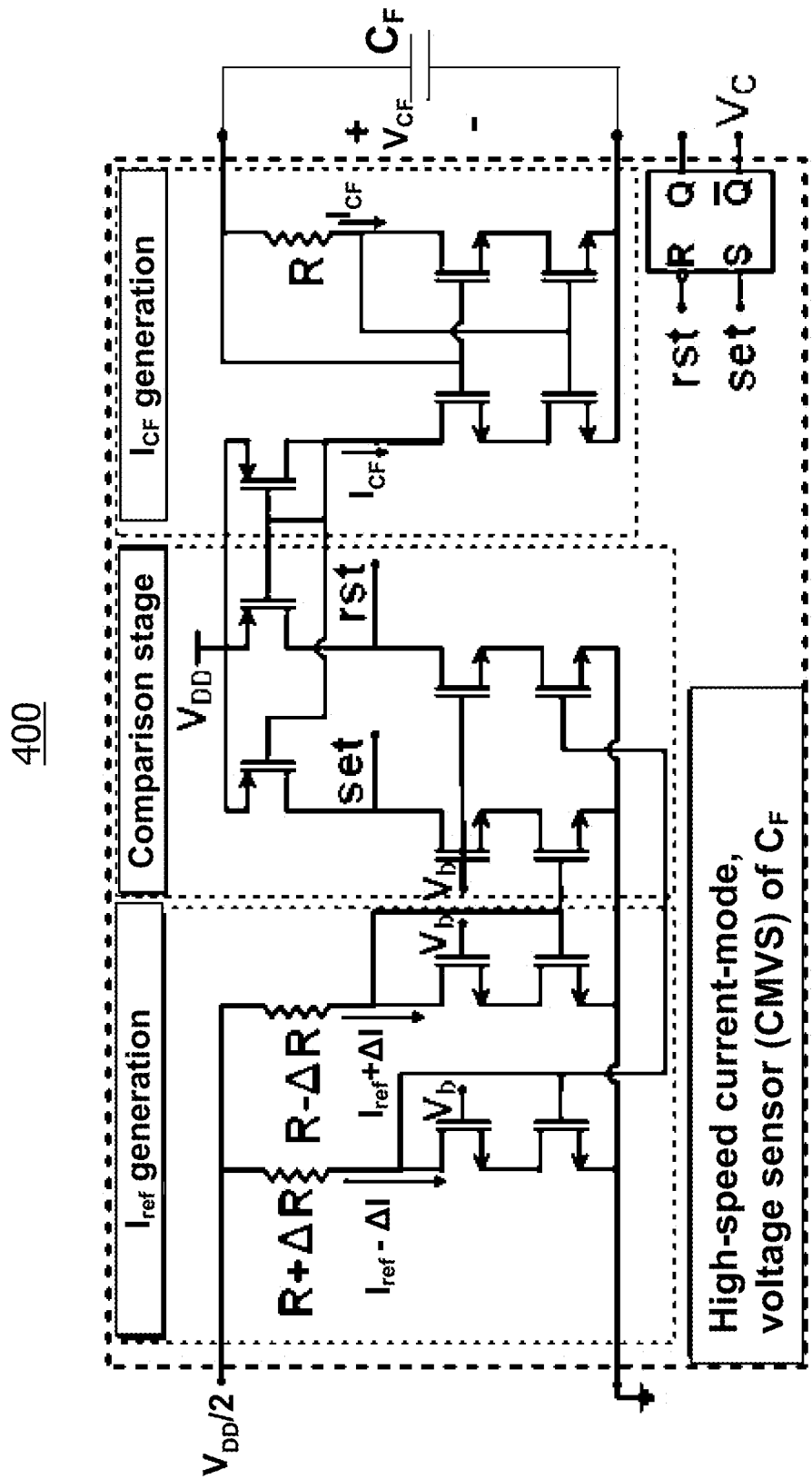
FIG. 4 illustrates a schematic diagram of an electronic circuit, in accordance with an embodiment.

Turning ahead in the drawings, FIG. 4 illustrates high-speed current-mode voltage sensor (CMVS) 400, according to an embodiment. In many embodiments, CMVS 400 can be configured to determine whether $V_{CF}$ is in the desired range, $V_{DD}/2 \pm \Delta V$. CMVS 400 is merely exemplary, and embodiments of CMVS 400 are not limited to the embodiment presented herein. CMVS 400 can be employed in many different embodiments or examples not specifically depicted or described herein. For example, CMVS 400 can be employed, in part or entirely, in electronic circuit 100 in FIG. 1 as flying capacitor voltage comparator 140.

As illustrated in FIG. 4, CMVS 400 can comprise a high-speed control loop and be configured to:
Convert the $V_{CF}$ to current ($I_{CF}$) using a diode connected transistor and resistor R;
Convert $V_{DD}/2$ to reference currents ($I_{ref} \pm \Delta I$) proportional to $V_{DD}/2 \pm \Delta V$ and mirror into a comparison stage with $I_{CF}$; and Comparing $I_{CF}$ with $I_{ref} \pm \Delta I$ triggers proper set or reset signal for an RS latch to produce the control signal $V_C$ for the hysteresis controller to regulate $V_{CF}$.

In the embodiment illustrated in FIG. 4, CMVS 400 can comprise: a first current converting circuit configured to generate a reference current, $I_{ref}$, that includes two reference currents, $I_{ref} - \Delta I$ and $I_{ref} + \Delta I$; a second current converting circuit configured to generate a flying capacitor current, $I_{CF}$; and a current comparison circuit configured to compare $I_{ref}$ and $I_{CF}$ and output: (1) a logic high when $I_{CF}$ is less than $I_{ref}$, or more precise, less than $I_{ref} - \Delta I$, (2) a logic low when $I_{CF}$ is greater than $I_{ref} + \Delta I$, and (3) a previous state when $I_{CF}$ is between $I_{ref} - \Delta I$ and $I_{ref} + \Delta I$.

In many embodiments, CMVS 400 can comprise any suitable electronic components, such as one or more resistors, one or more transistors, and one or more latches. In many embodiments, each of the one or more transistors of CMVS 400 can be a Field-Effect Transistor (FET) or a bipolar transistor. As an example, a FET can be a Metal-Oxide-Semiconductor FET (MOSFET), a Junction FET (JFET), or a MEtal-Semiconductor FET (MESFET). As another example, a bipolar transistor can be a heterojunction bipolar transistor or a homojunction bipolar transistor. In many embodiments, the one or more transistors of CMVS 400 can each have three terminals, including a gate terminal, a source terminal, and a drain terminal, and be categorized into two types, either n-type transistors or p-type transistors. The three terminals of a FET can comprise a gate electrode (i.e., a gate terminal), a drain electrode (i.e., a drain terminal), and a source electrode (i.e., a source terminal). The three terminals of a bipolar transistor can comprise a base electrode (i.e., a gate terminal), a collector electrode (i.e., a source terminal), and an emitter electrode (i.e., a drain terminal). For example, in an embodiment, a p-type transistor of CMVS 400 can be a p-channel MOSFET, and an n-type transistor of CMVS 400 can be an n-channel MOSFET. In many embodiments, the term "three-terminal transistor" is defined as a transistor having at least three terminals. Therefore, the three-terminal device can also have four or more terminals. For example, the three-terminal transistor in an embodiment can be a FET with an additional bulk or backgate electrode that is coupled to a voltage potential.

Figure 5:
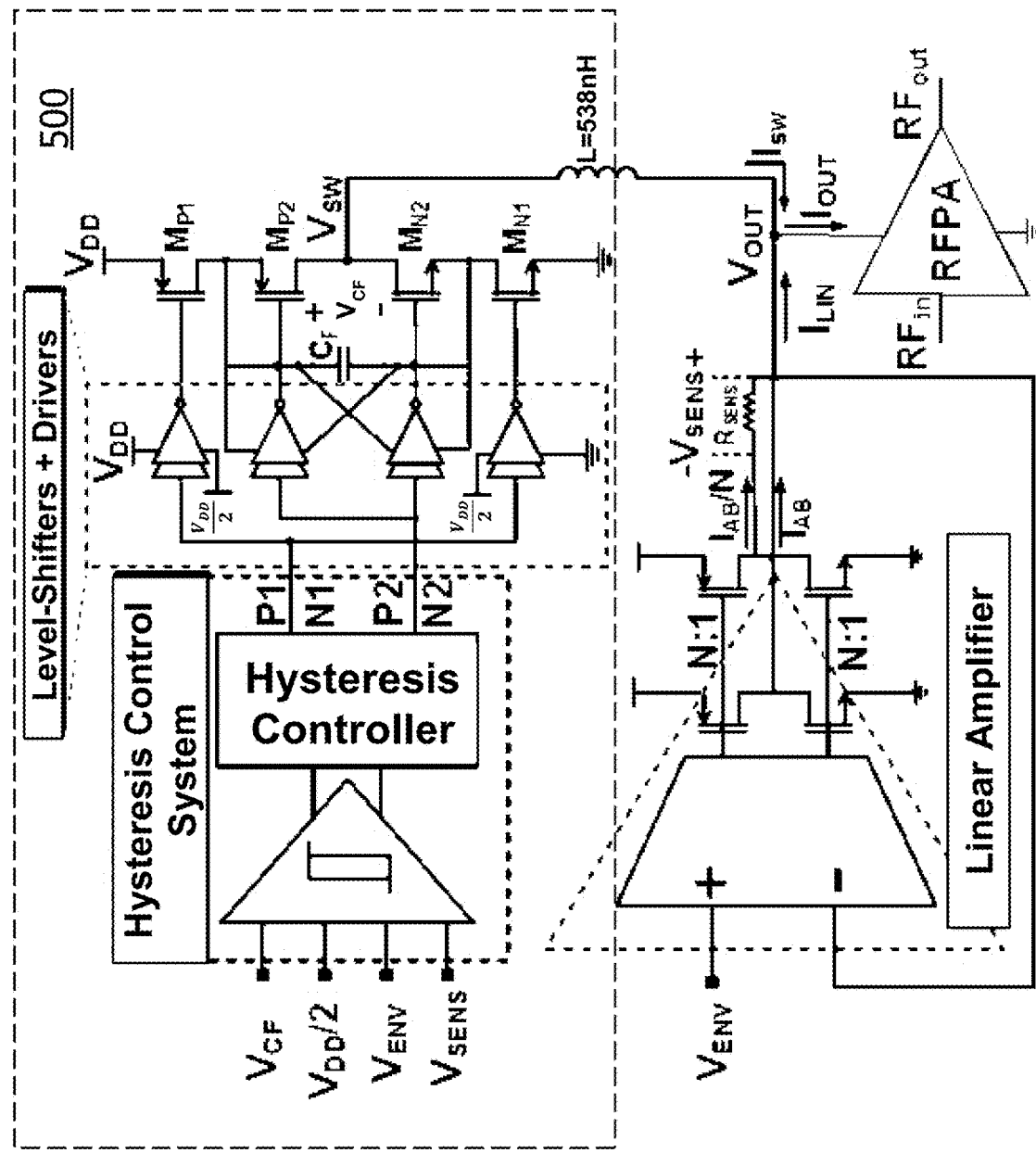
FIG. 5 illustrates a schematic diagram of a larger electronic circuit, in accordance with an embodiment.

Turning ahead in the drawings, FIG. 5 illustrates hysteretic-controlled three-level converter 500, according to an embodiment. In many embodiments, hysteretic-controlled three-level converter 500 can comprise a hysteresis control system (Hysteresis Control System) configured to provide output load current. Hysteretic-controlled three-level converter 500 and Hysteresis Control System illustrated in FIG. 5 are merely exemplary, and embodiments of hysteretic-controlled three-level converter 500 and Hysteresis Control System are not limited to the embodiment presented herein. For example, electronic circuit 100 (FIG. 1), electronic circuit 200 (FIG. 2), electronic circuit 300 (FIG. 3), and/or CMVS 400 (FIG. 4) can be adopted, in part or entirely, as Hysteresis Control System in the embodiment in FIG. 5. Hysteretic-controlled three-level converter 500 and/or Hysteresis Control System can be employed in many different embodiments or examples not specifically depicted or described herein. In many embodiments, hysteretic-controlled three-level converter 500 and/or Hysteresis Control System can be employed in an envelope tracking (ET) modulator, a direct current to direct current (DC-DC) converter, an average power tracking (APT) modulator, etc.

As illustrated in FIG. 5, hysteretic-controlled three-level converter 500 operates in parallel with a linear amplifier (Linear Amplifier) to provide an output load current, $T_{OUT}$. The inputs of Hysteresis Control System in this embodiment include:

- $V_{CF}$ and $V_{DD}/2$: Hysteresis Control System in this embodiment can comprise a current-mode voltage sensor, such as CMVS 400 in FIG. 4, with a proper control signal generated based on $V_{CF}$;
- $V_{SENS}$: Hysteresis Control System in this embodiment can receive $V_{SENS}=V_{OUT}-V_{REF}$, a differential voltage between the two terminals of a resistor $R_{SENS}$, and control the loop of hysteretic-controlled three-level converter 500 based on $V_{SENS}$; and
- $V_{ENV}$: Hysteresis Control System in this embodiment can receive $V_{ENV}$ to compare with $V_{DD}/2$ and generate a proper control signal, such as $V_{cont}$ (FIG. 1) for multiplexers 160 (FIG. 1) and 170 (FIG. 1).

Figure 6:
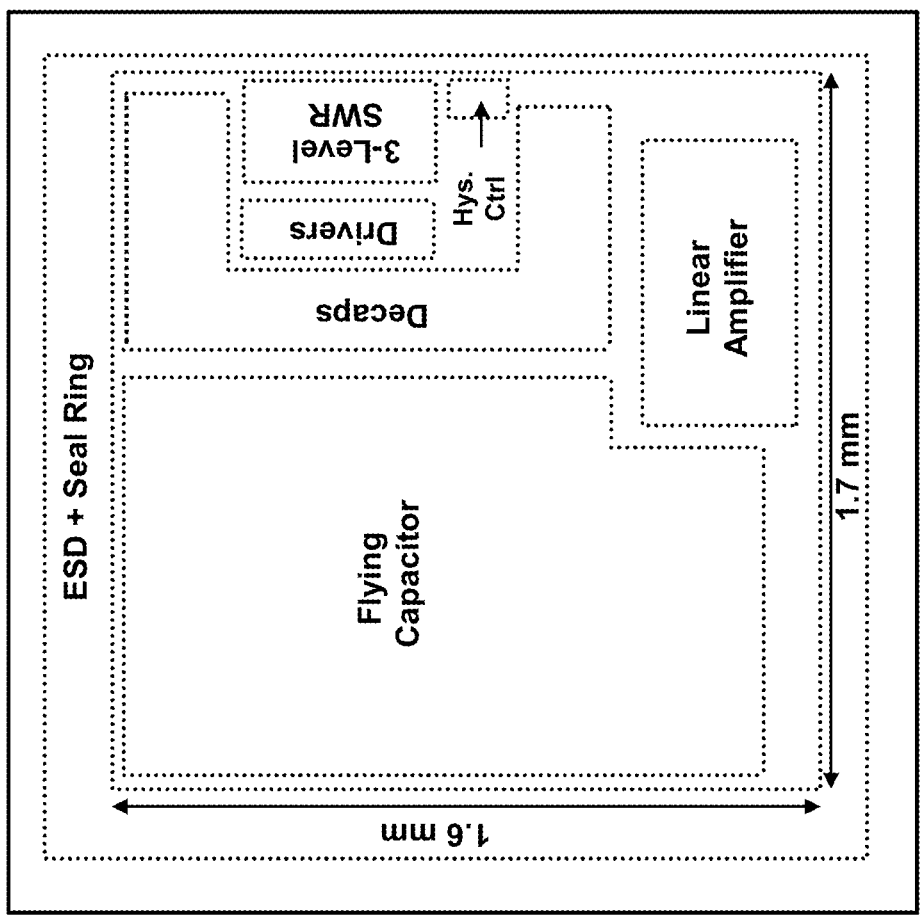
FIG. 6 illustrates a schematic diagram of a die of an electronic circuit, in accordance with an embodiment.

Turning ahead in the drawings, FIG. 6 illustrates a schematic diagram of a die of electronic circuit 600, in accordance with an embodiment. In this embodiment illustrated in FIG. 6, electronic circuit 600 comprises a 65 nm CMOS, 1.7 mm×1.6 mm area, and 12 nF on-chip CF, and is configured to receive a 2.4V DC supply. Electronic circuit 600 is merely exemplary, and embodiments of electronic circuit 600 are not limited to the embodiment presented herein. Electronic circuit 600 can be employed in many different embodiments or examples not specifically depicted or described herein. For example, electronic circuit 100 (FIG. 1), electronic circuit 200 (FIG. 2), electronic circuit 300 (FIG. 3), CMVS 400 (FIG. 4), and/or hysteretic-controlled three-level converter 500 (FIG. 5) can be adopted, in part or entirely, as electronic circuit 600.

Figure 7:
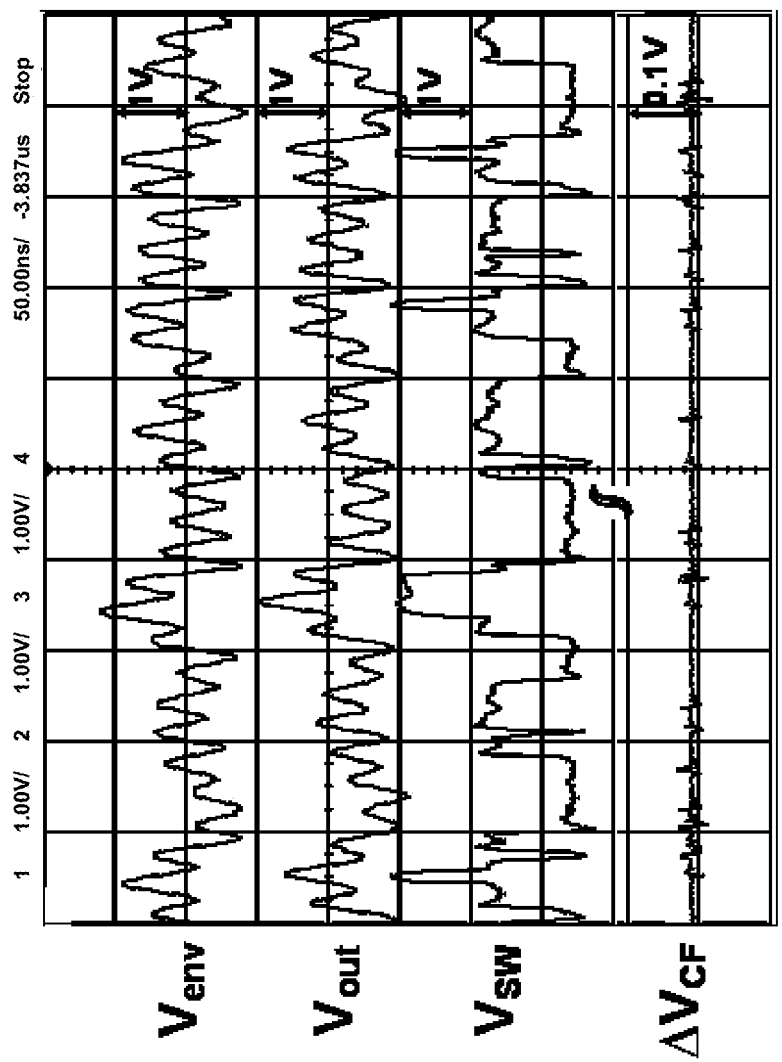
FIG. 7 illustrates a graphical representation of voltages at various nodes of an electronic circuit over a period of time, in accordance with an embodiment.

Turning ahead in the drawings, FIG. 7 illustrates a graphical representation of voltages at various nodes of electronic circuit 700 over a period of time, in accordance with an embodiment. Electronic circuit 700 is merely exemplary, and embodiments of electronic circuit 700 are not limited to the embodiment presented herein. Electronic circuit 700 can be employed in many different embodiments or examples not specifically depicted or described herein. In many embodiments, electronic circuit 700 can be employed in an envelope tracking modulator, a DC-DC converter, or an average power tracking modulator. For example, electronic circuit 100 (FIG. 1), electronic circuit 200 (FIG. 2), electronic circuit 300 (FIG. 3), CMVS 400 (FIG. 4), hysteretic-controlled three-level converter 500 (FIG. 5), and/or electronic circuit 600 (FIG. 6) can be adopted, in part or entirely, as electronic circuit 700.

In the embodiment illustrated in FIG. 7, electronic circuit 700 is employed in an envelope tracking modulator comprising: an LTE-80 MHz envelope signal with QPSK modulation and 7.84 dB PAPR, and can be configured to have a three-level operation at a switching node:

- A voltage across capacitor $\Delta V_{CF}$ is regulated to 1.2V with ±20 mV accuracy; and
- A switching node voltage, $V_{SW}$, switches between three different levels of 0, 1.2V and 2.4V according to the input envelope level.

Figure 8:
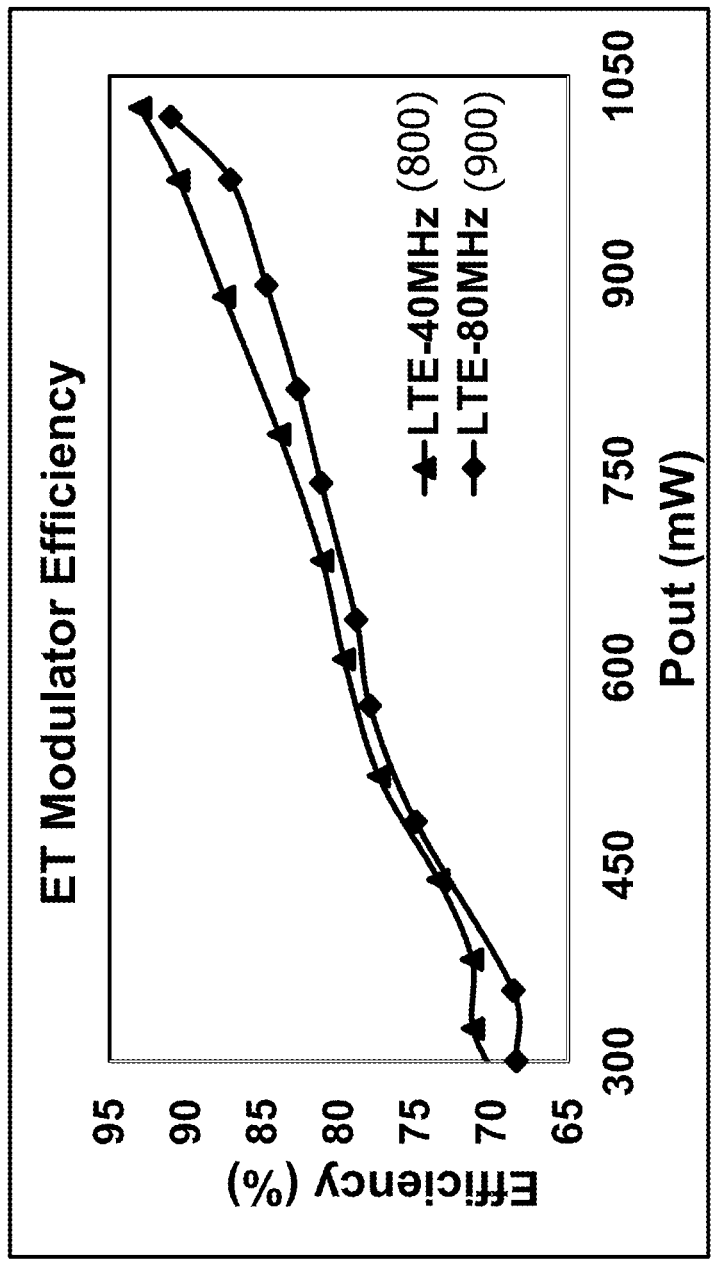
FIG. 8 illustrates a graphical representation of performance of an electronic circuit, in accordance with two embodiments.

Turning ahead in the drawings, FIG. 8 illustrates a graphical representation of performances of electronic circuits 800 and 900, in accordance with two embodiments. For example, electronic circuit 800 can comprise an envelope tracking modulator including an LTE-80 MHz envelope signal with peak efficiency of 91%; and electronic circuit 900 can comprise an envelope tracking modulator including an LTE-40 MHz envelope signal with peak efficiency of 93%. Electronic circuits 800 and 900 are merely exemplary, and embodiments of electronic circuits 800 and 900 are not limited to the embodiment presented herein. Electronic circuits 800 and 900 can be employed in many different embodiments or examples not specifically depicted or described herein. For example, electronic circuit 100 (FIG. 1), electronic circuit 200 (FIG. 2), electronic circuit 300 (FIG. 3), CMVS 400 (FIG. 4), hysteretic-controlled three-level converter 500 (FIG. 5), and/or electronic circuit 600 (FIG. 6) can be adopted, in part or entirely, as electronic circuits 800 and/or 900.

In an embodiment, an electronic circuit can comprise: a first circuit portion; a second circuit portion; a flying capacitor voltage comparator; and an output switching circuit. In this embodiment, the first circuit portion, such as first circuit portion 110 (FIG. 1) or first circuit portion (a) (FIG. 2), can comprise a first circuit first input node; a first circuit second input node; a first circuit first output node; and a first circuit second output node. In this embodiment, when the first circuit first input node is pulled high, the first circuit first output node and the first circuit second output node can both be pulled high; when the first circuit first input node is pulled low and when the first circuit second input node is pulled low, the first circuit first output node can be pulled high and the first circuit second output node can be pulled low; and when the first circuit first input node is pulled low and when the first circuit second input node is pulled high, the first circuit first output node can be pulled low and the first circuit second output node can be pulled high.

In this embodiment, the second circuit portion, such as second circuit portion 120 (FIG. 1) or second circuit portion (b) (FIG. 3), can comprise a second circuit first input node; a second circuit second input node; a second circuit first output node; and a second circuit second output node. In this embodiment, when the second circuit first input node and the second circuit second input node are both pulled high, the second circuit first output node can be pulled high and the second circuit second output node can be pulled low; when the second circuit first input node is pulled high and when the second circuit second input node is pulled low, the second circuit first output node can be pulled low and the second circuit second output node can be pulled high; and when the first circuit first input node is pulled low, the second circuit first output node and the second circuit second output node can both be pulled low.

In this embodiment, the first circuit first input node of the first circuit portion and the second circuit first input node of the second circuit portion can be electrically coupled to an indication of whether an output voltage of a switching converter, such as a three-level switching converter for an ET modulator, DC-DC converter, or an APT modulator, electronic circuit 500 (FIG. 5), electronic circuit 600 (FIG. 6), electronic circuit 700 (FIG. 7), electronic circuit 800 or 900 (FIG. 8), is higher in magnitude than a reference voltage of the switching converter.

In this embodiment, a voltage sensor output terminal of the flying capacitor voltage comparator, such as CMVS 400 (FIG. 4), can be electrically coupled to both the first circuit second input node of the first circuit portion and the second circuit second input node of the second circuit portion and can comprise an output value that is indicative of whether a constant half source voltage (i.e., $V_{DD}/2$ of the switching converter) is higher in magnitude than a flying capacitor voltage (i.e., $V_{CF}$, the voltage across a flying capacitor $C_F$ of the switching converter). In this embodiment, when the constant half source voltage ($V_{DD}/2$) is higher in magnitude than the reference voltage, $V_{REF}$ or $V_{ENV}$, the switching circuit, such as switch circuit including hysteresis comparator 150 (A1) (FIG. 1), multiplexer 160 (FIG. 1), and multiplexer 170 (FIG. 1), can be configured to: electrically couple the electronic circuit first output node to the first circuit first output node of the first circuit portion; and electrically couple the electronic circuit second output node to the first circuit second output node of the first circuit portion.

In this embodiment, when the constant half source voltage ($V_{DD}/2$) is not higher in magnitude than the reference voltage, the switching circuit can be configured to: electrically couple the electronic circuit first output node to the second circuit first output node of the second circuit portion; and electrically couple the electronic circuit second output node to the second circuit second output node of the second circuit portion. In another embodiment, a method can be configured to use any one of the aforementioned electronic circuits for controlling a three-level switching converter.

Although electronic circuits and methods for controlling a three-level switching converter have been described with reference to specific embodiments, it will be understood by those skilled in the art that various changes may be made without departing from the spirit or scope of the disclosure. Accordingly, the disclosure of embodiments is intended to be illustrative of the scope of the disclosure and is not intended to be limiting. It is intended that the scope of the disclosure shall be limited only to the extent required by the appended claims. For example, to one of ordinary skill in the art, it will be readily apparent that any element of FIGS. 1-8 may be modified, and that the foregoing discussion of certain of these embodiments does not necessarily represent a complete description of all possible embodiments.

Replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims, unless such benefits, advantages, solutions, or elements are stated in such claim.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

The invention claimed is:

1. An electronic circuit comprising:
a first circuit portion comprising:
  a first circuit first input node;
  a first circuit second input node;
  a first circuit first output node; and
  a first circuit second output node;
  wherein:
    when the first circuit first input node is pulled high, the first circuit first output node and the first circuit second output node are both pulled high;
    when the first circuit first input node is pulled low and when the first circuit second input node is pulled low, the first circuit first output node is pulled high and the first circuit second output node is pulled low; and
    when the first circuit first input node is pulled low and when the first circuit second input node is pulled high, the first circuit first output node is pulled low and the first circuit second output node is pulled high;

a second circuit portion comprising:
  a second circuit first input node;
  a second circuit second input node;
  a second circuit first output node; and
  a second circuit second output node;
  wherein:
    when the second circuit first input node and the second circuit second input node are both pulled high, the second circuit first output node is pulled high and the second circuit second output node is pulled low;
    when the second circuit first input node is pulled high and when the second circuit second input node is pulled low, the second circuit first output node is pulled low and the second circuit second output node is pulled high; and
    when the first circuit first input node is pulled low, the second circuit first output node and the second circuit second output node are both pulled low;

a flying capacitor voltage comparator;
an output switching circuit;
an electronic circuit first output node configured to be electrically coupled to a first gate terminal of a switching converter; and
an electronic circuit second output node configured to be electrically coupled to a second gate terminal of the switching converter,
wherein:
  the first circuit first input node of the first circuit portion and the second circuit first input node of the second circuit portion are electrically coupled to an indication of whether an output voltage of the switching converter is higher in magnitude than a reference voltage of the switching converter;
  a voltage sensor output terminal of the flying capacitor voltage comparator is electrically coupled to the first circuit second input node of the first circuit portion and the second circuit second input node of the second circuit portion;
  an output value of the voltage sensor output terminal is indicative of whether a constant half source voltage is higher or lower in magnitude than a flying capacitor voltage;
  the constant half source voltage is a half of a power source voltage of the switching converter;
  the flying capacitor voltage is a voltage across a flying capacitor of the switching converter;
  when the constant half source voltage is higher in magnitude than the reference voltage, the output switching circuit is configured to:
    electrically couple the electronic circuit first output node to the first circuit first output node of the first circuit portion; and
    electrically couple the electronic circuit second output node to the first circuit second output node of the first circuit portion; and
  when the constant half source voltage is not higher in magnitude than the reference voltage, the output switching circuit is configured to:
    electrically couple the electronic circuit first output node to the second circuit first output node of the second circuit portion; and
    electrically couple the electronic circuit second output node to the second circuit second output node of the second circuit portion.

2. The electronic circuit of claim 1, wherein:
the first circuit portion further comprises:
  a first OR gate;
  a second OR gate;
  a first NOT gate; and
  a second NOT gate;
the first circuit first input node is electrically coupled to a first input terminal of the first OR gate and a first input terminal of the second OR gate;
the first circuit second input node is electrically coupled to an input terminal of the first NOT gate;
an output terminal of the first NOT gate is electrically coupled to a second input terminal of the first OR gate and an input terminal of the second NOT gate;
an output terminal of the second NOT gate is electrically coupled to a second input terminal of the second OR gate;
the first circuit first output node is electrically coupled to an output terminal of the first OR gate; and
the first circuit second output node is electrically coupled to an output terminal of the second OR gate.

3. The electronic circuit of claim 1, wherein:
the second circuit portion further comprises:
  a first AND gate;
  a second AND gate; and
  a NOT gate;
the second circuit first input node is electrically coupled to a first input terminal of the first AND gate and a first input terminal of the second AND gate;
the second circuit second input node is electrically coupled to a second input terminal of the first AND gate and an input terminal of the NOT gate;
an output terminal of the NOT gate is electrically coupled to a second input terminal of the second AND gate;
the second circuit first output node is electrically coupled to an output terminal of the first AND gate; and
the second circuit second output node is electrically coupled to an output terminal of the second AND gate.

4. The electronic circuit of claim 1, wherein:
the output switching circuit further comprises:
  a switching comparator;
  a first four-terminal multiplexer; and
  a second four-terminal multiplexer;
a first input terminal of the switching comparator is configured to receive the constant half source voltage;
a second input terminal of the switching comparator is configured to receive the reference voltage;
an output terminal of the switching comparator is electrically coupled to both a control terminal of the first four-terminal multiplexer and a control terminal of the second four-terminal multiplexer;
a first input terminal of the first four-terminal multiplexer is electrically coupled to the first circuit first output node of the first circuit portion;
a second input terminal of the first four-terminal multiplexer is electrically coupled to the second circuit second output node of the second circuit portion;
a first input terminal of the second four-terminal multiplexer is electrically coupled to the first circuit second output node of the first circuit portion;
a second input terminal of the second four-terminal multiplexer is electrically coupled to the second circuit first output node of the second circuit portion;
an output terminal of the first four-terminal multiplexer is electrically coupled to the electronic circuit first output node; and
an output terminal of the second four-terminal multiplexer is electrically coupled to the electronic circuit second output node.

5. The electronic circuit of claim 1, wherein:
the flying capacitor voltage comparator further comprises:
  a first current converting circuit;
  a second current converting circuit; and
  a current comparison circuit;
the first current converting circuit is configured to generate a half source current from the constant half source voltage;
the second current converting circuit is configured to generate a flying capacitor current from the flying capacitor voltage;
when the flying capacitor current is less than the half source current, an output terminal of the current comparison circuit is pulled high; and
when the flying capacitor current is no less than the half source current, the output terminal of the current comparison circuit is pulled low.

6. The electronic circuit of claim 5, wherein:
the half source current comprises a lower tolerance limit current and an upper tolerance limit current;
when the flying capacitor current is less than the lower tolerance limit current, the output terminal of the current comparison circuit is pulled high; and
when the flying capacitor current is no less than the lower tolerance limit current, the output terminal of the current comparison circuit is pulled low.

7. The electronic circuit of claim 6, wherein:
the first current converting circuit comprises:
  a first circuit path configured to generate the lower tolerance limit current, comprising:
    a first resistor comprising:
      a first resistance value;
      a first resistor top terminal electrically coupled to a constant half source voltage node configured to supply the constant half source voltage; and
      a first resistor bottom terminal;
    a first top n-type transistor comprising:
      a first top gate terminal electrically coupled to a bias voltage node configured to supply a bias voltage;
      a first top source terminal electrically coupled to the first resistor bottom terminal of the first resistor; and
      a first top drain terminal; and
    a first bottom n-type transistor comprising:
      a first bottom gate terminal electrically coupled to the first resistor bottom terminal of the first resistor;
      a first bottom source terminal electrically coupled to the first top drain terminal of the first top n-type transistor; and
      a first bottom drain terminal electrically coupled to a ground node; and
  a second circuit path configured to generate the upper tolerance limit current, comprising:
    a second resistor comprising:
      a second resistance value;
      a second resistor top terminal electrically coupled to the constant half source voltage node; and
      a second resistor bottom terminal;
    a second top n-type transistor comprising:
      a second top gate terminal electrically coupled to the bias voltage node;

a second top source terminal electrically coupled to the second resistor bottom terminal of the second resistor; and
a second top drain terminal; and
a second bottom n-type transistor comprising:
a second bottom gate terminal electrically coupled to the second resistor bottom terminal of the second resistor;
a second bottom source terminal electrically coupled to the second top drain terminal of the second top n-type transistor; and
a second bottom drain terminal electrically coupled to the ground node; and
the first resistance value is greater than the second resistance value.

8. The electronic circuit of claim 7, wherein:
the second current converting circuit comprises:
a third circuit path configured to generate the flying capacitor current, comprising:
a third resistor comprising:
a third resistance value;
a third resistor top terminal electrically coupled to a positive terminal of the flying capacitor; and
a third resistor bottom terminal;
a third top n-type transistor comprising:
a third top gate terminal electrically coupled to the positive terminal of the flying capacitor;
a third top source terminal electrically coupled to the third resistor bottom terminal of the third resistor; and
a third top drain terminal; and
a third bottom n-type transistor comprising:
a third bottom gate terminal electrically coupled to the third resistor bottom terminal of the third resistor;
a third bottom source terminal electrically coupled to the third top drain terminal of the third top n-type transistor; and
a third bottom drain terminal electrically coupled to a negative terminal of the flying capacitor;
the third resistance value is greater than the second resistance value; and
the third resistance value is less than the first resistance value.

9. The electronic circuit of claim 8, wherein:
the current comparison circuit comprises:
a first mirror circuit path comprising:
a first mirror p-type transistor comprising:
a first mirror p-type transistor gate terminal;
a first mirror p-type transistor source terminal electrically coupled to a power source node configured to supply the power source voltage; and
a first mirror p-type transistor drain terminal;
a first mirror top n-type transistor comprising:
a first mirror top gate terminal electrically coupled to the bias voltage node;
a first mirror top source terminal electrically coupled to the first mirror p-type transistor drain terminal of the first mirror p-type transistor; and
a first mirror top drain terminal; and
a first mirror bottom n-type transistor comprising:
a first mirror bottom gate terminal electrically coupled to the first resistor bottom terminal of the first resistor of the first circuit path of the first current converting circuit;
a first mirror bottom source terminal electrically coupled to the first mirror top drain terminal of the first mirror top n-type transistor; and
a first mirror bottom drain terminal electrically coupled to the ground node;
a second mirror circuit path comprising:
a second mirror p-type transistor comprising:
a second mirror p-type transistor gate terminal;
a second mirror p-type transistor source terminal electrically coupled to the power source node; and
a second mirror p-type transistor drain terminal;
a second mirror top n-type transistor comprising:
a second mirror top gate terminal electrically coupled to the bias voltage node;
a second mirror top source terminal electrically coupled to the second mirror p-type transistor drain terminal of the second mirror p-type transistor; and
a second mirror top drain terminal;
a second mirror bottom n-type transistor comprising:
a second mirror bottom gate terminal electrically coupled to the second resistor bottom terminal of the second resistor of the second circuit path of the first current converting circuit;
a second mirror bottom source terminal electrically coupled to the second mirror top drain terminal of the second mirror top n-type transistor; and
a second mirror bottom drain terminal electrically coupled to the ground node;
a third mirror circuit path comprising:
a third mirror p-type transistor comprising:
a third mirror p-type transistor gate terminal;
a third mirror p-type transistor source terminal electrically coupled to the power source node; and
a third mirror p-type transistor drain terminal;
a third mirror top n-type transistor comprising:
a third mirror top gate terminal electrically coupled to the positive terminal of the flying capacitor;
a third mirror top source terminal electrically coupled to the third mirror p-type transistor drain terminal of the third mirror p-type transistor; and
a third mirror top drain terminal; and
a third mirror bottom n-type transistor comprising:
a third mirror bottom gate terminal electrically coupled to the third resistor bottom terminal of the third resistor of the third circuit path of the second current converting circuit;
a third mirror bottom source terminal electrically coupled to the third mirror top drain terminal of the third mirror top n-type transistor; and
a third mirror bottom drain terminal electrically coupled to the negative terminal of the flying capacitor; and
a latch comprising:
a set input terminal electrically coupled to the second mirror top drain terminal of the second mirror top n-type transistor;
an opposite reset input terminal electrically coupled to the first mirror top drain terminal of the first mirror top n-type transistor; and
a complement queue output terminal,
wherein:
when the set input terminal and the opposite reset input terminal are both pulled low, the complement queue output terminal is pulled high; and when the set input terminal and the opposite reset input terminal are both pulled high, the complement queue output terminal is pulled low;

the first mirror p-type transistor gate terminal, the second mirror p-type transistor gate terminal, and the third mirror p-type transistor gate terminal are electrically coupled to the third mirror p-type transistor drain terminal; and the output terminal of the current comparison circuit is electrically coupled to the complement queue output terminal of the latch.

10. The electronic circuit of claim 1 further comprising:
a sensing comparator,
wherein:
   a first input terminal of the sensing comparator is configured to receive the output voltage of the switching converter;
   a second input terminal of the sensing comparator is configured to receive the reference voltage of the switching converter; and
   an output terminal of the sensing comparator is electrically coupled to the first circuit first input node of the first circuit portion and the second circuit first input node of the second circuit portion.

11. A method comprising:
providing a first circuit portion, wherein:
   the first circuit portion comprises:
     a first circuit first input node;
     a first circuit second input node;
     a first circuit first output node; and
     a first circuit second output node;
   when the first circuit first input node is pulled high, the first circuit first output node and the first circuit second output node are both pulled high;
   when the first circuit first input node is pulled low and when the first circuit second input node is pulled low, the first circuit first output node is pulled high and the first circuit second output node is pulled low; and
   when the first circuit first input node is pulled low and when the first circuit second input node is pulled high, the first circuit first output node is pulled low and the first circuit second output node is pulled high;
providing a second circuit portion, wherein:
   the second circuit portion comprises:
     a second circuit first input node;
     a second circuit second input node;
     a second circuit first output node; and
     a second circuit second output node;
   when the second circuit first input node and the second circuit second input node are both pulled high, the second circuit first output node is pulled high and the second circuit second output node is pulled low;
   when the second circuit first input node is pulled high and when the second circuit second input node is pulled low, the second circuit first output node is pulled low and the second circuit second output node is pulled high; and
   when the first circuit first input node is pulled low, the second circuit first output node and the second circuit second output node are both pulled low;
providing a flying capacitor voltage comparator;
providing an output switching circuit;
providing an electronic circuit first output node configured to be electrically coupled to a first gate terminal of a switching converter;
providing an electronic circuit second output node configured to be electrically coupled to a second gate terminal of the switching converter; and
electrically coupling a voltage sensor output terminal of the flying capacitor voltage comparator to the first circuit second input node of the first circuit portion and the second circuit second input node of the second circuit portion,
wherein:
   the first circuit first input node of the first circuit portion and the second circuit first input node of the second circuit portion are configured to be electrically coupled to an indication of whether an output voltage of the switching converter is higher in magnitude than a reference voltage of the switching converter;
   an output value of the voltage sensor output terminal is indicative of whether a constant half source voltage is higher or lower in magnitude than a flying capacitor voltage;
   the constant half source voltage is a half of a power source voltage of the switching converter;
   the flying capacitor voltage is a voltage across a flying capacitor of the switching converter;
   when the constant half source voltage is higher in magnitude than the reference voltage, the output switching circuit is configured to:
     electrically couple the electronic circuit first output node to the first circuit first output node of the first circuit portion; and
     electrically couple the electronic circuit second output node to the first circuit second output node of the first circuit portion; and
   when the constant half source voltage is not higher in magnitude than the reference voltage, the output switching circuit is configured to:
     electrically couple the electronic circuit first output node to the second circuit first output node of the second circuit portion; and
     electrically couple the electronic circuit second output node to the second circuit second output node of the second circuit portion.

12. The method of claim 11, wherein:
the first circuit portion further comprises:
   a first OR gate;
   a second OR gate;
   a first NOT gate; and
   a second NOT gate; and
the method further comprises:
   electrically coupling the first circuit first input node to a first input terminal of the first OR gate and a first input terminal of the second OR gate;
   electrically coupling the first circuit second input node to an input terminal of the first NOT gate;
   electrically coupling an output terminal of the first NOT gate to a second input terminal of the first OR gate and an input terminal of the second NOT gate;
   electrically coupling an output terminal of the second NOT gate to a second input terminal of the second OR gate;
   electrically coupling the first circuit first output node to an output terminal of the first OR gate; and
   electrically coupling the first circuit second output node to an output terminal of the second OR gate.

13. The method of claim 11, wherein:
the second circuit portion further comprises:
   a first AND gate;
   a second AND gate; and
   a NOT gate; and the method further comprises:
electrically coupling the second circuit first input node to a first input terminal of the first AND gate and a first input terminal of the second AND gate;
electrically coupling the second circuit second input node to a second input terminal of the first AND gate and an input terminal of the NOT gate;
electrically coupling an output terminal of the NOT gate to a second input terminal of the second AND gate;
electrically coupling the second circuit first output node to an output terminal of the first AND gate; and
electrically coupling the second circuit second output node to an output terminal of the second AND gate.

14. The method of claim 11, wherein:
the output switching circuit further comprises:
a switching comparator;
a first four-terminal multiplexer; and
a second four-terminal multiplexer;
a first input terminal of the switching comparator is configured to receive the constant half source voltage;
a second input terminal of the switching comparator is configured to receive the reference voltage; and
the method further comprises:
electrically coupling an output terminal of the switching comparator to both a control terminal of the first four-terminal multiplexer and a control terminal of the second four-terminal multiplexer;
electrically coupling a first input terminal of the first four-terminal multiplexer to the first circuit first output node of the first circuit portion;
electrically coupling a second input terminal of the first four-terminal multiplexer to the second circuit second output node of the second circuit portion;
electrically coupling a first input terminal of the second four-terminal multiplexer to the first circuit second output node of the first circuit portion;
electrically coupling a second input terminal of the second four-terminal multiplexer to the second circuit first output node of the second circuit portion;
electrically coupling an output terminal of the first four-terminal multiplexer to the electronic circuit first output node; and
electrically coupling an output terminal of the second four-terminal multiplexer to the electronic circuit second output node.

15. The method of claim 11, wherein:
the flying capacitor voltage comparator further comprises:
a first current converting circuit;
a second current converting circuit; and
a current comparison circuit;
the first current converting circuit is configured to generate a half source current from the constant half source voltage;
the second current converting circuit is configured to generate a flying capacitor current from the flying capacitor voltage;
when the flying capacitor current is less than the half source current, an output terminal of the current comparison circuit is pulled high; and
when the flying capacitor current is no less than the half source current, the output terminal of the current comparison circuit is pulled low.

16. The method of claim 15, wherein:
the half source current comprises a lower tolerance limit current and an upper tolerance limit current;
when the flying capacitor current is less than the lower tolerance limit current, the output terminal of the current comparison circuit is pulled high; and
when the flying capacitor current is no less than the lower tolerance limit current, the output terminal of the current comparison circuit is pulled low.

17. The method of claim 16, wherein:
the first current converting circuit comprises:
a first circuit path configured to generate the lower tolerance limit current, comprising:
a first resistor comprising:
a first resistance value;
a first resistor top terminal electrically coupled to a constant half source voltage node configured to supply the constant half source voltage; and
a first resistor bottom terminal;
a first top n-type transistor comprising:
a first top gate terminal electrically coupled to a bias voltage node configured to supply a bias voltage;
a first top source terminal electrically coupled to the first resistor bottom terminal of the first resistor; and
a first top drain terminal; and
a first bottom n-type transistor comprising:
a first bottom gate terminal electrically coupled to the first resistor bottom terminal of the first resistor;
a first bottom source terminal electrically coupled to the first top drain terminal of the first top n-type transistor; and
a first bottom drain terminal electrically coupled to a ground node; and
a second circuit path configured to generate the upper tolerance limit current, comprising:
a second resistor comprising:
a second resistance value;
a second resistor top terminal electrically coupled to the constant half source voltage node; and
a second resistor bottom terminal;
a second top n-type transistor comprising:
a second top gate terminal electrically coupled to the bias voltage node;
a second top source terminal electrically coupled to the second resistor bottom terminal of the second resistor; and
a second top drain terminal; and
a second bottom n-type transistor comprising:
a second bottom gate terminal electrically coupled to the second resistor bottom terminal of the second resistor;
a second bottom source terminal electrically coupled to the second top drain terminal of the second top n-type transistor; and
a second bottom drain terminal electrically coupled to the ground node; and
the first resistance value is greater than the second resistance value.

18. The method of claim 17, wherein:
the second current converting circuit comprises:
a third circuit path configured to generate the flying capacitor current, comprising:
a third resistor comprising:
a third resistance value;
a third resistor top terminal electrically coupled to a positive terminal of the flying capacitor; and
a third resistor bottom terminal;

a third top n-type transistor comprising:
  a third top gate terminal electrically coupled to the positive terminal of the flying capacitor;
  a third top source terminal electrically coupled to the third resistor bottom terminal of the third resistor; and
  a third top drain terminal; and
a third bottom n-type transistor comprising:
  a third bottom gate terminal electrically coupled to the third resistor bottom terminal of the third resistor;
  a third bottom source terminal electrically coupled to the third top drain terminal of the third top n-type transistor; and
  a third bottom drain terminal electrically coupled to a negative terminal of the flying capacitor;
the third resistance value is greater than the second resistance value; and
the third resistance value is less than the first resistance value.

19. The method of claim 18, wherein:
the current comparison circuit comprises:
  a first mirror circuit path comprising:
    a first mirror p-type transistor comprising:
      a first mirror p-type transistor gate terminal;
      a first mirror p-type transistor source terminal electrically coupled to a power source node configured to supply the power source voltage; and
      a first mirror p-type transistor drain terminal;
    a first mirror top n-type transistor comprising:
      a first mirror top gate terminal electrically coupled to the bias voltage node;
      a first mirror top source terminal electrically coupled to the first mirror p-type transistor drain terminal of the first mirror p-type transistor; and
      a first mirror top drain terminal; and
    a first mirror bottom n-type transistor comprising:
      a first mirror bottom gate terminal electrically coupled to the first resistor bottom terminal of the first resistor of the first circuit path of the first current converting circuit;
      a first mirror bottom source terminal electrically coupled to the first mirror top drain terminal of the first mirror top n-type transistor; and
      a first mirror bottom drain terminal electrically coupled to the ground node;
  a second mirror circuit path comprising:
    a second mirror p-type transistor comprising:
      a second mirror p-type transistor gate terminal;
      a second mirror p-type transistor source terminal electrically coupled to the power source node; and
      a second mirror p-type transistor drain terminal;
    a second mirror top n-type transistor comprising:
      a second mirror top gate terminal electrically coupled to the bias voltage node;
      a second mirror top source terminal electrically coupled to the second mirror p-type transistor drain terminal of the second mirror p-type transistor; and
      a second mirror top drain terminal;
    a second mirror bottom n-type transistor comprising:
      a second mirror bottom gate terminal electrically coupled to the second resistor bottom terminal of the second resistor of the second circuit path of the first current converting circuit;
      a second mirror bottom source terminal electrically coupled to the second mirror top drain terminal of the second mirror top n-type transistor; and
      a second mirror bottom drain terminal electrically coupled to the ground node;
  a third mirror circuit path comprising:
    a third mirror p-type transistor comprising:
      a third mirror p-type transistor gate terminal;
      a third mirror p-type transistor source terminal electrically coupled to the power source node; and
      a third mirror p-type transistor drain terminal;
    a third mirror top n-type transistor comprising:
      a third mirror top gate terminal electrically coupled to the positive terminal of the flying capacitor;
      a third mirror top source terminal electrically coupled to the third mirror p-type transistor drain terminal of the third mirror p-type transistor; and
      a third mirror top drain terminal; and
    a third mirror bottom n-type transistor comprising:
      a third mirror bottom gate terminal electrically coupled to the third resistor bottom terminal of the third resistor of the third circuit path of the second current converting circuit;
      a third mirror bottom source terminal electrically coupled to the third mirror top drain terminal of the third mirror top n-type transistor; and
      a third mirror bottom drain terminal electrically coupled to the negative terminal of the flying capacitor; and
  a latch comprising:
    a set input terminal electrically coupled to the second mirror top drain terminal of the second mirror top n-type transistor;
    an opposite reset input terminal electrically coupled to the first mirror top drain terminal of the first mirror top n-type transistor; and
    a complement queue output terminal,
    wherein:
      when the set input terminal and the opposite reset input terminal are both pulled low, the complement queue output terminal is pulled high; and
      when the set input terminal and the opposite reset input terminal are both pulled high, the complement queue output terminal is pulled low; and
the method further comprises:
  electrically coupling the first mirror p-type transistor gate terminal, the second mirror p-type transistor gate terminal, and the third mirror p-type transistor gate terminal to the third mirror p-type transistor drain terminal; and
  electrically coupling the output terminal of the current comparison circuit to the complement queue output terminal of the latch.

20. The method of claim 11 further comprising:
providing a sensing comparator; and
electrically coupling an output terminal of the sensing comparator to the first circuit first input node of the first circuit portion and the second circuit first input node of the second circuit portion,
wherein:
  a first input terminal of the sensing comparator is configured to receive the output voltage of the switching converter; and a second input terminal of the sensing comparator is configured to receive the reference voltage of the switching converter.

* * * * *